(12) United States Patent
Uzoh

(10) Patent No.: US 8,076,237 B2
(45) Date of Patent: Dec. 13, 2011

(54) METHOD AND APPARATUS FOR 3D INTERCONNECT

(75) Inventor: Cyprian Emeka Uzoh, San Jose, CA (US)

(73) Assignee: ASM America, Inc., Phoenix, AZ (US)

( * ) Notice: Subject to any disclaimer, the term of this patent is extended or adjusted under 35 U.S.C. 154(b) by 600 days.

(21) Appl. No.: 12/118,596

(22) Filed: May 9, 2008

(65) Prior Publication Data

US 2009/0280648 A1 Nov. 12, 2009

(51) Int. Cl.
*H01L 21/44* (2006.01)

(52) U.S. Cl. .......... 438/669; 257/E21.553; 257/E21.585

(58) Field of Classification Search .............. 438/6, 128, 438/422, 456, 598, 618, 627, 669; 257/520, 257/534, 618, 622, E33.069, E33.128, E23.131, 257/E21.238, E21.553, E21.585
See application file for complete search history.

(56) References Cited

U.S. PATENT DOCUMENTS

| | | | |
|---|---|---|---|
| 4,058,430 A | 11/1977 | Suntola et al. | |
| 4,389,973 A | 6/1983 | Suntola et al. | |
| 5,855,680 A | 1/1999 | Soininen et al. | |
| 6,013,553 A | 1/2000 | Wallace | |
| 6,287,965 B1 | 9/2001 | Kang et al. | |
| 6,342,427 B1 * | 1/2002 | Choi et al. | 438/422 |
| 6,420,279 B1 | 7/2002 | Ono et al. | |
| 6,511,539 B1 | 1/2003 | Raaijmakers | |
| 6,590,251 B2 | 7/2003 | Kang et al. | |
| 6,627,503 B2 | 9/2003 | Ma et al. | |
| 6,734,090 B2 * | 5/2004 | Agarwala et al. | 438/598 |
| 6,824,665 B2 | 11/2004 | Shelnut et al. | |
| 6,858,547 B2 | 2/2005 | Metzner | |
| 6,875,677 B1 | 4/2005 | Conley, Jr. et al. | |
| 6,930,059 B2 | 8/2005 | Conley, Jr. et al. | |
| 7,053,009 B2 | 5/2006 | Conley, Jr. et al. | |
| 7,071,051 B1 | 7/2006 | Jeon et al. | |
| 7,129,165 B2 | 10/2006 | Basol et al. | |
| 7,132,360 B2 | 11/2006 | Schaeffer et al. | |
| 7,135,421 B2 | 11/2006 | Ahn et al. | |
| 7,147,766 B2 | 12/2006 | Uzoh et al. | |
| 7,172,497 B2 | 2/2007 | Basol et al. | |
| 7,192,824 B2 | 3/2007 | Ahn et al. | |
| 7,192,892 B2 | 3/2007 | Ahn et al. | |
| 7,205,247 B2 | 4/2007 | Lee et al. | |
| 7,235,501 B2 | 6/2007 | Ahn et al. | |
| 7,312,494 B2 | 12/2007 | Ahn et al. | |
| 7,393,736 B2 | 7/2008 | Ahn et al. | |
| 7,402,534 B2 | 7/2008 | Mahajani | |
| 7,405,166 B2 | 7/2008 | Liang et al. | |

(Continued)

OTHER PUBLICATIONS

PCT; International Search report and Written Opinion dated Nov. 12, 2010 in Application No. PCT/US2010/030126.

(Continued)

*Primary Examiner* — Matthew W Such
*Assistant Examiner* — Monica D Harrison
(74) *Attorney, Agent, or Firm* — David E. Rogers; Damon Boyd; Snell & Wilmer LLP

(57) ABSTRACT

The present invention discloses methods for depositing a material, particularly a conductive material, in cavities of a substrate and forming bonding contacts or pads thereon. An intracavity structure may be utilized in conjunction with embodiments of the present invention to provide efficient filling of diverse cavities within the substrate. Also provided are embodiments for interconnection structures using filled cavities, along with electrically conductive or reactive structures which may include capacitors fabricated within a substrate.

42 Claims, 17 Drawing Sheets

U.S. PATENT DOCUMENTS

| | | |
|---|---|---|
| 7,405,454 B2 | 7/2008 | Ahn et al. |
| 7,414,281 B1 | 8/2008 | Fastow |
| 2002/0001974 A1 | 1/2002 | Chan |
| 2002/0064592 A1 | 5/2002 | Datta et al. |
| 2004/0144980 A1 | 7/2004 | Ahn et al. |
| 2004/0168627 A1 | 9/2004 | Conley et al. |
| 2004/0198069 A1 | 10/2004 | Metzner et al. |
| 2005/0023624 A1 | 2/2005 | Ahn et al. |
| 2005/0070123 A1 | 3/2005 | Hirano |
| 2005/0110069 A1 | 5/2005 | Kil et al. |
| 2005/0214457 A1 | 9/2005 | Schmitt et al. |
| 2005/0214458 A1 | 9/2005 | Meiere |
| 2005/0218462 A1 | 10/2005 | Ahn et al. |
| 2005/0271813 A1 | 12/2005 | Kher et al. |
| 2006/0013946 A1 | 1/2006 | Park et al. |
| 2006/0019033 A1 | 1/2006 | Muthukrishnan et al. |
| 2006/0046518 A1 | 3/2006 | Hill et al. |
| 2006/0051925 A1 | 3/2006 | Ahn et al. |
| 2006/0060930 A1 | 3/2006 | Metz et al. |
| 2006/0062910 A1 | 3/2006 | Meiere |
| 2006/0113675 A1 | 6/2006 | Chang et al. |
| 2006/0128168 A1 | 6/2006 | Ahn et al. |
| 2006/0148180 A1 | 7/2006 | Ahn et al. |
| 2006/0193979 A1 | 8/2006 | Meiere et al. |
| 2006/0208215 A1 | 9/2006 | Metzner et al. |
| 2006/0223301 A1 | 10/2006 | Vanhaelemeersch et al. |
| 2006/0228888 A1 | 10/2006 | Lee et al. |
| 2006/0257563 A1 | 11/2006 | Doh et al. |
| 2006/0258078 A1 | 11/2006 | Lee et al. |
| 2006/0266289 A1 | 11/2006 | Verghese et al. |
| 2007/0031599 A1 | 2/2007 | Gschwandtner et al. |
| 2007/0037412 A1 | 2/2007 | Dip et al. |
| 2007/0059948 A1 | 3/2007 | Metzner et al. |
| 2007/0065578 A1 | 3/2007 | McDougall |
| 2007/0066010 A1 | 3/2007 | Ando |
| 2007/0134942 A1 | 6/2007 | Ahn et al. |
| 2007/0232501 A1 | 10/2007 | Tonomura |
| 2007/0252244 A1 | 11/2007 | Srividya et al. |
| 2008/0054332 A1 | 3/2008 | Kim et al. |
| 2008/0057659 A1 | 3/2008 | Forbes et al. |
| 2008/0124908 A1 | 5/2008 | Forbes et al. |
| 2008/0176375 A1 | 7/2008 | Erben et al. |
| 2008/0224240 A1 | 9/2008 | Ahn et al. |
| 2008/0233288 A1 | 9/2008 | Clark |
| 2008/0261413 A1 | 10/2008 | Mahajani |
| 2008/0282970 A1 | 11/2008 | Heys et al. |
| 2009/0011608 A1 | 1/2009 | Nabatame |

OTHER PUBLICATIONS

PCT; International Search report and Written Opinion dated Jan. 20, 2011 in Application No. PCT/US2010/045368.

Chang et al. Small-Subthreshold-Swing and Low-Voltage Flexible Organic Thin-Film Transistors Which Use HfLaO as the Gate Dielectric; IEEE Electron Device Letters; Feb. 2009; 133-135; vol. 30, No. 2; IEEE Electron Device Society.

Maeng et al. Electrical properties of atomic layer disposition Hf02 and Hf0xNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea.

* cited by examiner

METHOD AND APPARATUS FOR 3D INTERCONNECT

DESCRIPTION OF THE INVENTION

1. Field of the Invention

The present invention relates to a method and apparatus for providing electrical interconnects. More specifically, the present invention relates to fabricating connective structures within defined areas of a substrate such as a semiconductor wafer, a semiconductor chip, a multichip module, or a printed wiring assembly. Further, the present invention relates to embodiments of electrically reactive interconnect components.

2. Background of the Invention

Creating electrical interconnections is a challenging and essential part of manufacturing compact electronic components and systems, particularly in the field of manufacturing integrated circuits. Over time, automated methods have been developed to deposit conductive materials on substrates, in layers of substrates, or through cavities such as trenches, holes, and vias of a substrate. Deposition of materials in such cavities provides for electrical interconnections between conductive traces on multiple layers of a substrate, essentially connecting components and terminals in various locations of the substrate to create an integrated circuit or system. More specifically, in typical integrated circuits, multiple levels of interconnect networks extend laterally with respect to the substrate surface. Interconnects formed in parallel substrate interlayers can thus be electrically connected using vias or cavities filled with conductive materials.

In a typical integrated circuit fabrication process, first an insulating interlayer is formed on a semiconductor substrate. Patterning and etching processes (such as those incorporating reactive ion etching (RIE)) are employed to form features such as trenches, vias, and cavities in the insulating layer. Then a conductive material such as copper is deposited to fill the cavities by processes such as sputtering, CVD, electrodeposition, electroless plating, or a combination of those approaches. Once the conductive material is applied, a conventional process such as chemical-mechanical polishing/planarization (CMP) is employed to remove the excess conductive material that was deposited above the top surface of the substrate. This removal results in an essentially flat surface, which is substantially planar with the top surface of the remainder of the substrate. These processes are repeated multiple times to manufacture multi-layer interconnects.

Recently, research has been applied in the semiconductor fields to three-dimensional (3D) wafer- and package-level integration, which is becoming an increasingly important enabling technology for integrated circuits and packages. Three-dimensional integration offers potentials for higher device and package performance, greater interconnectivity and functionality, heterogeneous systems integration, reductions in packaging size and cost, and improvements in device and/or package reliability. One of the proposed approaches to implement 3D interconnection utilizes arrays of vias or cavities, which may vary dramatically in size within the same substrate.

Exemplary embodiments of prior art processes may be explained though review of FIGS. 1A, 1B, 2, and 3. Referring to FIG. 1A, a substrate 130 forms the mechanical support for an electrical interconnect system such as an integrated circuit 100, which is shown with a smaller via/cavity 110 and a substantially larger via/cavity 120. The illustrated vias or cavities 110, 120 may have been created by conventional processes such as patterning and etching. The vias or cavities such as the larger via 120 may include a void area in the substrate 130, having sidewalls 123 and a bottom 124. FIG. 1B depicts an exemplary cross section of the integrated circuit substrate 130 shown in FIG. 1A, the cross section being taken through line formed between points A-A' in FIG. 1A. A conducting layer 140 is shown conformally coating the vias or cavities 110, 120 and the top surface 133 of the substrate 130, which may include an insulating layer such as $SiO_2$. The conducting layer 140 often comprises a barrier layer 155, and may also comprise a seed layer 157 which may be deposited on the barrier layer 155. Depending on the particular process used, the seed layer may range from 20 to 4000 angstroms in thickness. The barrier layer 155 coats the insulating layer to ensure good adhesion and acts as a barrier material to prevent diffusion of conductive materials such as copper into the insulating layers and into semiconductor devices fabricated in the substrate 130. The seed layer 157 forms a conductive material base for metal crystal growth such as when copper is used during subsequent metal depositions.

The illustrations in FIG. 1A and FIG. 1B show that some cavities or vias such as the larger via 120 may range in diameter 121 from 5 μm to 2000 μm or more. The depth 122 of vias or cavities 110, 120, may range between 20 to 1000 μm. More importantly perhaps, the dimensions of vias or cavities 110, 120 may vary substantially with respect to one another. This variation creates complications in implementing a cost- and time-efficient integrated circuit fabrication system.

In prior art systems, providing electrical conductivity through vias or cavities 110, 120 usually involves selectively applying a plating process to deposit conductive substances on or within the cavities or vias 110, 120. When depositing conductive material over the substrate 130, it is desirable to overfill the cavities to, for example, 20% to 200% of the via or cavity depth 122 in order to minimize defects in the wiring structure. However, when the dimensions of vias or cavities 110, 120 vary substantially within in the same substrate 130, the procedures required to consistently and reliably fill cavities of such varying sizes results in an expensive and high-cost production process. For example, with respect to FIG. 2, for a substrate 230 containing vias 210, 220 with diameters varying between 5 μm to 500 μm and approximately 50 μm deep, the smallest vias such as the illustrated 5 μm diameter via 210 may be completely filled with a conductive material 250 in 15 minutes by conventional electrocoating methods, while larger cavities such as the illustrated 30 μm and larger via 220 are substantially under-filled. To completely fill all vias 210, 220, as is shown in FIG. 3, a conductive material 250 (such as a copper film) is deposited (such as by electroplating) onto the conducting layer 140, and the conductive material 250 quickly fills the small via 110 but coats the wide via 220 and the surface of the substrate 230 in a conformal manner. For practical purposes, the metal deposition process may be required to operate for more than two hours to completely fill the 500 μm via 220 depicted in FIG. 3. After the larger via 220 is filled, a substantial overburden 240 is also deposited on the substrate 230. The maximum thickness of the overburden 240 that overlies the top surface 133 of the substrate 230 is related to the depth (FIG. 1B, 122) of the feature with the largest width (FIG. 1B, 121), to be filled on the substrate 230, which is in this example the cavity or via 220. As cavities or vias are filled, the thickness of overburden varies. For example, the deposited overburden 240 is thicker above over areas of the substrate 230 without vias or cavities, and the overburden 240b is thinner above areas such as the wide via or cavity 220. The substantial range of thicknesses in overburden (240,

240b) is problematic in many ways, particularly in planarization of the top surface of the substrate 230.

The overburden 240 must ultimately be removed with a conventional process such as a chemical-mechanical planarization (CMP) procedure, by an electro-chemical mechanical polishing/planarization procedure (eCMP), by a wet etch procedure, or by their various combinations. Polishing to remove such a large range of overburden depths is time consuming and expensive. In an exemplary prior art process, such extensive planarization processes have a throughput of less than one-third wafer per hour. Apart from higher process costs, device yields after such extensive deposition and etching steps may be negatively impacted, resulting in large variations in desirable device parameters. For example, when attempting to remove an overburden with wide ranges of thicknesses (240a, 240b), the areas over vias or cavities such as the large cavity 220 in FIG. 3 may be subject to dishing, or the excessive removal of material resulting in the creation of a non-planar surface above vias or cavities. What is needed, then, is a process for efficiently filling cavities in a substrate, particularly when cavities in a substrate vary in size with respect to one another. What is also needed is a method for filling vias or cavities within a substrate while minimizing the range thicknesses of overburden deposited above all areas of the substrate. What is also needed is a process and apparatus to form electrically conductive or electrically reactive components within a cavity in a substrate. What is further needed is a method to form bonding pads utilizing conductive structures within cavities or vias.

SUMMARY OF THE INVENTION

Terminology

The terms, chip, integrated circuit, monolithic device, semiconductor device or component, microelectronic device or component, and similar terms and expressions, are often used interchangeably in this field. The present invention is applicable to all the above as they are generally understood in the field, as well as to printed circuit boards, printed wiring boards, and printed wiring assemblies, also which may be used interchangeably.

The terms metal line, trace, wire, conductor, signal path and signaling medium are all related. These terms are generally interchangeable, and appear in order from specific to general. In this field, metal lines are sometimes referred to as traces, wires, lines, interconnects, conductive materials, or simply metal. The term vertical, as used herein, means substantially perpendicular to the major surface of a substrate. The term horizontal, as used herein, means substantially parallel to the major surface of a substrate.

The terms "cavity" and "via" both refer to structures providing electrical connection of conductors from different interconnect levels within a substrate, or from within a substrate to a next higher level assembly. Vias and trenches are forms of cavities typically used to provide for interconnection within a device. Cavities that are filled to provide electrical connections between a plurality of levels may be considered vias. Cavities that are filled to provide electrical connections within the same level may be referred to as trenches. These terms are sometimes used in the art to describe both an opening in an insulator in which the structure will be completed, and the completed structure itself.

As used herein, the term "filled" also means "substantially filled."

Summary

The present invention discloses methods for depositing a material, particularly a conductive material, in cavities of a substrate and forming bonding contacts or pads thereon. Also provided are embodiments for interconnection structures using filled cavities, along with electrically reactive structures which may include capacitors fabricated within a substrate.

One embodiment includes a method for filling a cavity defined within a substrate, where the cavity has sidewalls, and optionally, a bottom. The method involves placing an intracavity structure within the cavity, the intracavity structure partitioning the cavity into a plurality of subcavities and substantially filling the subcavities with a conductive deposition material. As defined herein, partitioning may include a partial partitioning, that is, partitioning the cavity into subcavities that remain partially connected within the volume defined within the cavity. The intracavity structure may be fabricated outside the cavity and then placed within the cavity, or the intracavity structure may be fabricated within the cavity, by processes such as photolithography and etching.

The intracavity structure may comprise any suitable shape. In exemplary embodiments, structural elements of the intracavity structure may include an array of shaped elements such as hexagonal elements, conic elements, rectanguloid elements, cubic elements, trianguloid elements, torroidial elements, rhomboid elements, and combinations of those elements. In an alternate embodiment, the intracavity structure may comprise a plurality of elements that do not interconnect with one another, but provide structural support to the sidewalls and/or the bottom of a cavity or via. In another embodiment, the shaped elements of the intracavity structure, when aligned, form a substantially planar arrangement. In another embodiment, once the intracavity structure is placed within the cavity, at least part of the intracavity structure is reduced through a process such as etching, bringing the vertical dimension of the intracavity structure to an amount less than a predetermined vertical dimension of the sidewalls of the cavity.

In one embodiment, a barrier layer may be deposited on at least part of the intracavity structure, the bottom surface of the cavity, and/or the sidewalls of the cavity, for example, after the intracavity structure has been placed within the cavity. The barrier layer may be used to coat the sidewalls and/or bottom of the cavity to ensure good adhesion of further fill materials, and may act as a barrier material to prevent diffusion of conductive fill materials such as copper into the elements of the substrate such as insulating layers and semiconductor devices. The barrier layer may comprise any appropriate material, such as Ta, TaN, WCN, TiN, WN, TbN, VN, ZrN, CrN, WC, WN, NbN, AlN, or combinations of those materials.

In another embodiment, a seed layer may be deposited within at least a portion of the cavity. The seed layer forms a base for growth of a conductive material such as crystalline copper during subsequent conductive material deposition steps. In an alternate implementation, a second conductive layer may be deposited on the first layer of conductive deposition material in an amount sufficient to fill the cavity and create an overfilled volume above the tops of the cavity sidewalls. At least part of the second conductive layer may be removed to form a substantially planar surface with a top surface of the substrate by processes such as a CMP process, an eCMP process, or a milling process and other various combinations of these processes. The conductive material and the second conductive layer material deposited in the cavity, the subcavities, or on the substrate may comprise Cu, Ni, W, Au, Ag, Al, along with their alloys and other combinations of conductive materials.

In one implementation, a bonding layer, a barrier layer, or a combination of the two may be deposited on at least a portion of the surface of the planarized second conductive layer material. The barrier layer material may be any appropriate material such as CoP, NiP, CoBP, CoWP, along with their alloys and other combinations. The bonding layer may comprise indium, gold, copper, or other appropriate bonding materials.

In an alternate embodiment, functional components such as electrically reactive components may be formed within cavities by methods of the present invention. For example, but not by way of limitation, steps to form a reactive component such as a capacitor include depositing a conformal insulator within the cavity, depositing a conductive electrode layer on the conformal insulator, filling the remaining unoccupied volume of the cavity with a filling insulator; and planarizing the filling insulator to form a substantially planar surface with the substrate. The planarizing may be accomplished by processes such as a CMP process, an eCMP process, or a milling process, and combinations of these processes. The conductive electrode layer may be selected from materials such as Pt, Rh, WCN, and alpha-Ta.

In another implementation, methods of the present invention provide for partitioning the cavity into a plurality of subcavities, each of the subcavities having a respective predetermined subcavity volume. An initial conductive layer is deposited within at least one of the subcavity volumes, where the barrier layer is for electrical communication with a conductive element in the substrate. A conductive material may then be deposited within the plurality of subcavities. In one embodiment, the conductive material substantially fills at least one of the subcavity volumes to a predetermined amount. A second conducive material may be deposited proximate to the cavity defined within the substrate; and part of the second conductive material removed to form a substantially planar surface between the second conductive layer and a surface of the substrate such as the top of the substrate. In alternate embodiments, the predetermined subcavity volume is less than a volume of a second cavity defined within the substrate, where the cavity defined within the substrate and the second cavity are separated by at least part of the substrate.

In another embodiment, there is provided a method for filling a cavity defined within a substrate, the cavity having a bottom and sidewalls. The method includes placing a pre-formed structure within the cavity where the pre-formed structure partitions the cavity into a plurality of subcavities. The preformed structure may comprise any suitable material, but in certain embodiments may form conductive materials such as copper, aluminum, nickel, tungsten, silver, gold, or suitable alloys. The preformed structure may also, in alternate embodiments, comprise memory metals, or other composite substances such as alumina. In certain embodiments, the pre-formed structure has a predetermined vertical dimension less than a height dimension of the sidewalls and has a predetermined footprint area (e.g, the cross sectional area of a projection through the vertical dimension of the structure) that is less than or equal to an area of the bottom of the cavity. A metal layer is deposited within at least one of the subcavity volumes, where the metal layer is for electrical communication with a conductive element in the substrate such as a via or other conductive trace, and the subcavities are substantially filled with a conductive deposition material.

Another embodiment of the present invention provides for an interconnection feature that has a volume defined within a cavity in a substrate, one or more intracavity structures partitioning the volume into a plurality of subcavities; and a deposited metal layer substantially filling at least one of the plurality of subcavities. In one implementation, at least a portion of the deposited metal layer is for electrical communication with a conductive element of the substrate, such as a metal trace, a terminal of a component, or a via.

Embodiments of the present invention also provide for a substrate having electrically reactive component, such as a capacitor. The substrate, in one implementation, includes a cavity defined within the substrate, the cavity having a bottom and sidewalls. The substrate also has one or more intracavity structures residing within the cavity that partition the cavity into a plurality of subcavities, a conformal insulator coating the one or more intracavity structures, and a conductive electrode layer deposited within the cavity and in proximity to the conformal insulator. Embodiments further include a high-dielectric constant insulator deposited within the cavity and in communication with the conductive electrode layer, where the high-dielectric constant insulator substantially fills the volume in the cavity that is not occupied by the intracavity structures, the conformal insulator, and conductive electrode layer and forms a substantially planar surface with the substrate. Such an electrically reactive component may be fabricated in a variety of shapes and sizes, using geometries and materials (such as the choice of the high dielectric constant insulator) that are selected to achieve a desired electrical performance characteristic such as capacitance. In one embodiment, the substrate includes a cavity defined within the substrate, the cavity having sidewalls but no bottom and no top. In this embodiment, an intracavity structure may be inserted to begin the plating or deposition process, and at some point during the plating process, the intracavity structure may be removed from either the top or the bottom of the cavity, and once removed, plating process may be continued until the cavity has been filled to a desired amount. Removal of the intracavity structure may be by any appropriate means, such as mechanical force, chemical etching, RIE processes, or other techniques.

In another embodiment, there is provided a method for filling a cavity defined within a substrate, the cavity having sidewalls, including the steps of placing a pre-formed structure within the cavity, the pre-formed structure partitioning the cavity into a plurality of subcavities; depositing a metal layer within at least one of the subcavity volumes, wherein the metal layer is for electrical communication with a conductive element in the substrate; and substantially filling the subcavities with a conductive deposition material. In one implementation, the cavity further includes a bottom; and the pre-formed structure comprises a conductive material, has a predetermined vertical dimension less than a height dimension of the sidewalls, and has a predetermined footprint area less than or equal to an area of the bottom of the cavity. In an embodiment, the pre-formed structure comprises a non-conductive material; and has a predetermined footprint area less than or equal to an area of the bottom of the cavity. The pre-formed structure may reside entirely within, inside, or partially outside the via or cavity during application of a conductive material to the substrate, and after subcavities in the via or cavity are at least partially filled with a conductive deposition material, the pre-formed structure may be removed from the cavity and the substrate. Then a second conductive layer may be deposited on the previously deposited the conductive deposition material, the second conductive layer deposited in an amount sufficient to fill the cavity and create an overfill above a top surface of the substrate. At least a portion of the second conductive layer may then be removed to form a substantially planar surface including at least the second conductive layer and the substrate. In another embodiment, a second conductive layer may be deposited on a bottom surface of the substrate, the second conductive layer deposited in an amount sufficient to fill voids within the conductive deposition material; and then at least a portion of the second conductive layer may be removed to form a substantially planar surface on the bottom surface of the substrate. Further, an amount of conductive deposition material sufficient to fill the cavity and create an overfill above a top surface of the substrate may be deposited on a top side of the substrate; and at least a portion of the conductive deposition material may be removed to form a substantially planar surface including at least the conductive deposition material and a top surface of the substrate.

The accompanying drawings, which are incorporated in and constitute a part of this specification, illustrate several embodiments of the invention and together with the description, serve to explain the principles of the invention.

Figure 1A:
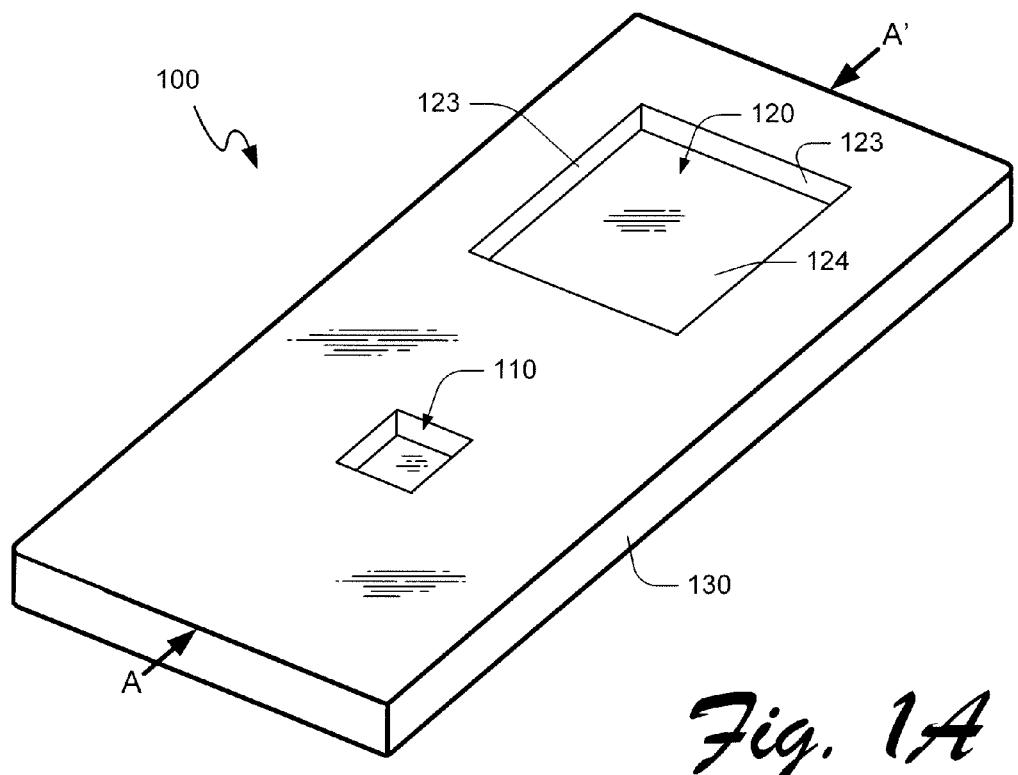
FIG. 1A is a perspective view of an electronic assembly of the prior art showing two cavities or vias.
Figure 1B:
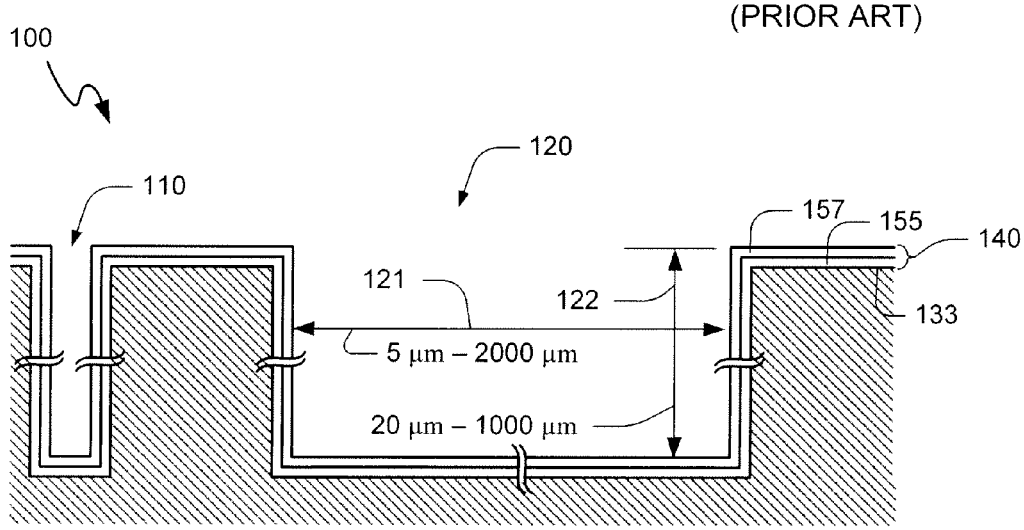
FIG. 1B is a cross-sectional view of a substrate of the prior art, the cross section being taken through a line formed between points A-A' in FIG. 1A.

It is to be understood that both the foregoing general description and the following detailed description are exemplary and explanatory only and are not restrictive of the invention, as claimed.

DESCRIPTION OF THE EMBODIMENTS

Introduction

While systems and methods consistent with the present invention are implemented using a semiconductor substrate such as a chip or wafer, at least as described below with reference to FIG. 4A, those skilled in the art understand that embodiments consistent with the present invention may be employed more generally. For example, a method or apparatus consistent with the present invention may be implemented with any assembly, flexible or rigid, that can be energized to convey electrical signals, including but not by way of limitation, wafers, flat panels, magnetic film heads, integrated circuits, electronic devices, semiconducting chips, and packaging substrates. While vias, cavities, voids, and volumes described herein are shown in the drawings generally with rectanguloid or cylindrical shapes, those of skill in the art appreciate that any shape that is suitable to retain an electrical interconnect within a substrate may be used to implement aspects of the present invention. Additionally, aspects of the present invention may be employed with any process for manufacturing integrated circuits, substrates, electronic assemblies, or printed wiring boards that currently exists or is later developed, as long as such processes are capable of depositing and removing elements of a conductive interconnect structure within a cavity in a substrate.

Description

Reference will now be made in detail to the present exemplary embodiments of the invention, examples of which are illustrated in the accompanying drawings.

Embodiments of the present invention address the problems encountered in depositing conductive materials on substrates with deep cavities, especially where the opening dimension of the cavities vary greatly. In some implementations, the dimensions of the cavities are such that the large cavities on the substrate may be only filled by conformal electrodeposition process. The present invention discloses a structure and process that improves device yield and throughput.

One embodiment of a method of the present invention includes placing one or more intracavity structures within a cavity prior to deposition of a conductive material. With reference to FIG. 4A, elements of the intracavity structure 400 are shown within a large cavity 120 in a partial view of a substrate 130. The substrate may be part of a semiconductor integrated circuit or other electronic assembly 100. The smaller via or cavity 110 may or may not include a similar structure to the illustrated intracavity structure 400, although those of skill in the art that any number of cavities within a substrate 130 may include such structures.

In one embodiment, the intracavity structure 400 is placed in the cavity 120 by fabrication. The intracavity structure 400 may be fabricated by use of one or more conventional lithographic steps and etching processes to create a recessed substructure within large cavities in the substrate. The material comprising the structure may include conductors such as copper, aluminum, nickel, tungsten, silver, gold, or suitable alloys, or may comprise nonconductors including aluminum oxide, epoxy-based or non-epoxy based resins. In another embodiment, an expendable intracavity structure 400 may comprise one or more high temperature waxes or other materials that could be readily dissolved in a suitable solvent. The expendable intracavity structure may be pre-formed and placed within the via or cavity 120, or fluidly deposited in the via or cavity 120 by patterning, extrusion, adhesion, or any appropriate technique, and such fluidly deposited expendable intracavity structure may form a desired shape comprising subcavities. In this embodiment, the expendable intracavity structure 400 may be dissolved or otherwise removed after the via or cavity 120 has been partially plated, and then the plating process continued until a desired amount of fill has been achieved within the via or cavity 120.

The intracavity structure 400 may also be partially or completely pre-fabricated outside of the cavity. The intracavity structure 400 may be prefabricated by conventional means including, but not limited to such manufacturing techniques as lithography, RIE, forging, stamping, casting, welding, or other automated fabrication process. Referring to FIG. 4B, the prefabricated intracavity structure 400 is shown being inserted into the cavity or via 120, the prefabricated intracavity structure 400 being dimensioned to fit within the volume defined by the cavity 120. The structure 400 may be inserted into the cavity, and aligned within the cavity by any conventional means such as optical, mechanical, electronic, or any other alignment means. Once inserted, the intracavity structure 400 may be adhered to one or more of the sidewalls 123, and if the cavity 120 has a defined bottom 124 as shown in FIG. 4B, the intracavity structure 400 may be adhered to the bottom 124 of the cavity 120. Alternatively, the intracavity structure 400 may be sized so as to be set back from each of the sidewalls 123 and adhered to the bottom 124 of the via or cavity 120. Adhesion may be accomplished through a pressure/friction fit, an ultrasonic weld, surface tension, or an adhesive, or may be simply retained by gravity until a further deposition step secures the structure within the cavity. Whether the intracavity structure 400 is fabricated within the cavity 120 or prefabricated and inserted into the cavity 120, those of skill in the art appreciate that elements of the intracavity structure 400 may abut the walls 123 of the cavity 120, or may be physically disjoint from connection with the cavity walls 123. Those of skill in the art also appreciate that while the elements of the intracavity structure 400 are generally shown as rectangularly shaped in cross section, different cross-sectional profiles may result from the manufacturing or deposition process that creates the elements of the intracavity structure 400, including both linear, trapezoidal, and curvilinear profiles.

The structure 400 may be fabricated from silicon wafer by lithographic and RIE techniques. The patterned silicon substrate may then be oxidized to form $SiO_2$ layer over its surfaces. Using this approach, selected plating substances such as copper will not adhere to the $SiO_2$ but will adhere to conductive silicon. Similar approaches may be used on an intracavity structure 400 that is intended to be removed from a cavity or via 120 after the via or cavity is partially or fully filled (see, e.g., FIGS. 13-19).

Figure 6A:
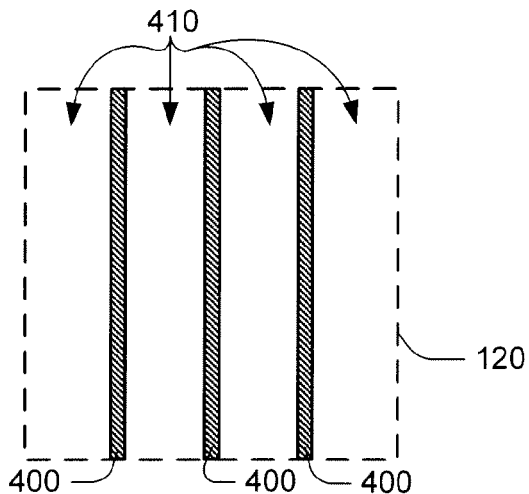
FIG. 6A is a plan view of an exemplary intracavity structure of the present invention showing an array of substantially parallel rectanguloid elements.
Figure 6B:
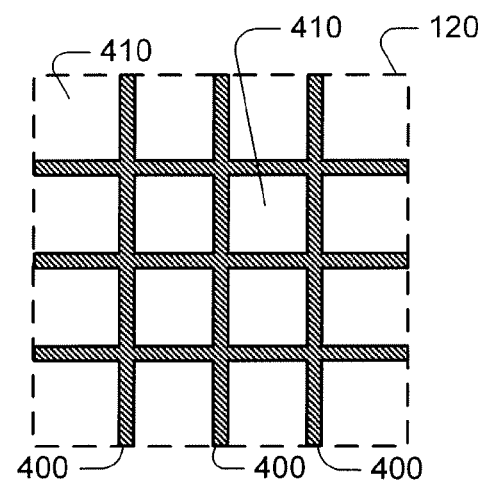
FIG. 6B is a plan view of an exemplary intracavity structure of the present invention showing an array of orthogonally disposed rectanguloid elements.
Figure 6C:
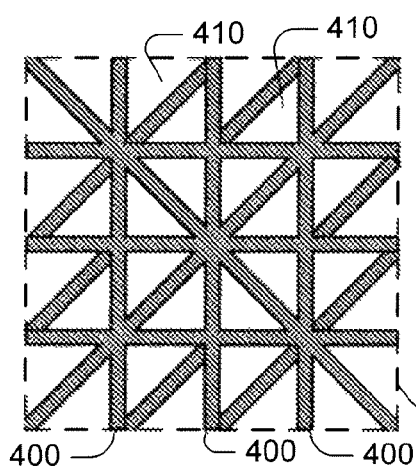
FIG. 6C is a plan view of an exemplary intracavity structure of the present invention showing rectanguloid elements disposed so as to create substantially trianguloid subcavities.
Figure 6D:
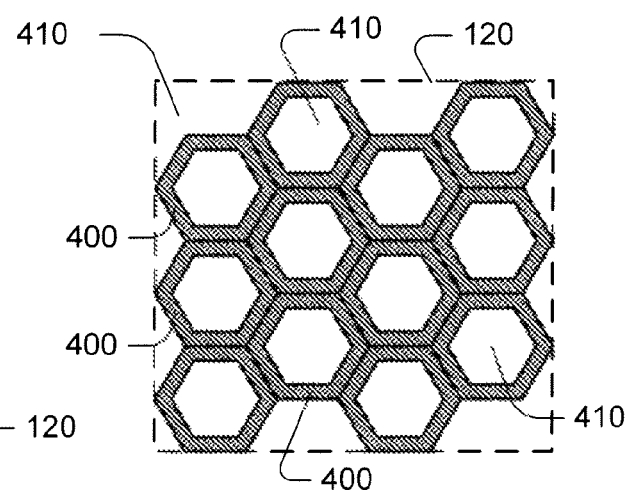
FIG. 6D is a plan view of an exemplary intracavity structure of the present invention showing a hexagonal elements disposed within a substantially rectanguloid cavity.
Figure 6E:
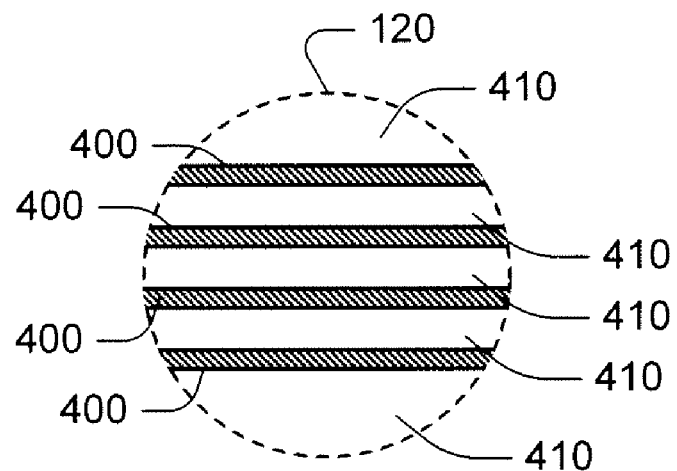
FIG. 6E is a plan view of an exemplary intracavity structure of the present invention showing an array of substantially parallel rectanguloid elements disposed within a substantially cylindrical cavity.
Figure 6F:
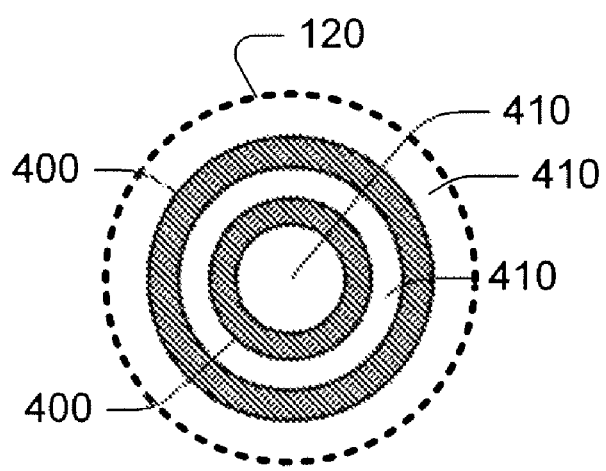
FIG. 6F is a plan view of an exemplary intracavity structure of the present invention showing an array of torrodial or cylindrical elements disposed within a substantially cylindrical cavity.

Referring to FIGS. 6A-6E, different embodiments of intracavity structure 400 are shown from a plan view in relation to embodiments of a cavity or via 120. As mentioned above, the elements of the intracavity structure 400 may or may not come into contact with sidewalls (not shown) of the cavity 120. Elements of the intracavity structure 400 may consist of curvilinear and non-curvilinear geometrical elements or combination of both. When placed within a via or cavity, the geometrical elements of the intracavity structure 400 wholly or partially partition the volume of the cavity into subcavities 410. Embodiments of the intracavity structure 400 may comprise elongate elements that do not touchingly engage one another (FIG. 6A); formations of elements that intersect in a substantially orthogonal manner (FIG. 6B), arrays of elements that are disposed to form triangularly-arranged subcavities (FIG. 6C, 410), and arrays of elements that are disposed to form an array of heaxgonoid-bounded subcavities (FIG. 6D, 410). As mentioned elsewhere herein, embodiments of the present invention do not limit vias or cavities to rectanguloid shapes. For example, FIGS. 6E and 6F show cylinder-shaped vias or cavities 120 from a plan view, and elements of intracavity structures 400 in a non-curvilinear arrangement (FIG. 6E) and a curvilinear arrangement (FIG. 6F). In each embodiment, the intracavity space is wholly or partially partitioned into subcavities 410. Those of skill in the art should recognize that other shapes may be used, and that combinations of shapes of elements may be utilized in varying embodiments of the present invention.

Figure 4A:
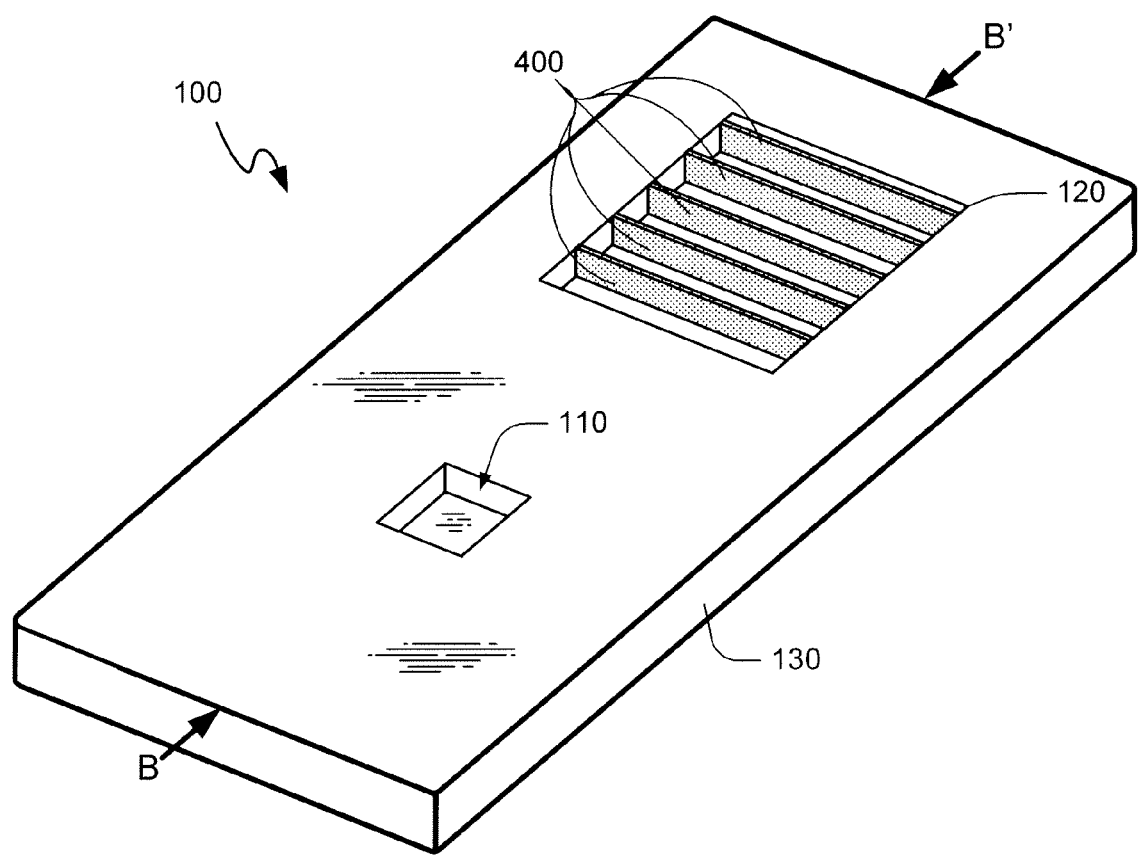
FIG. 4A is a perspective view of an electronic assembly of the present invention showing an intracavity structure placed within a cavity in a substrate.
Figure 4B:
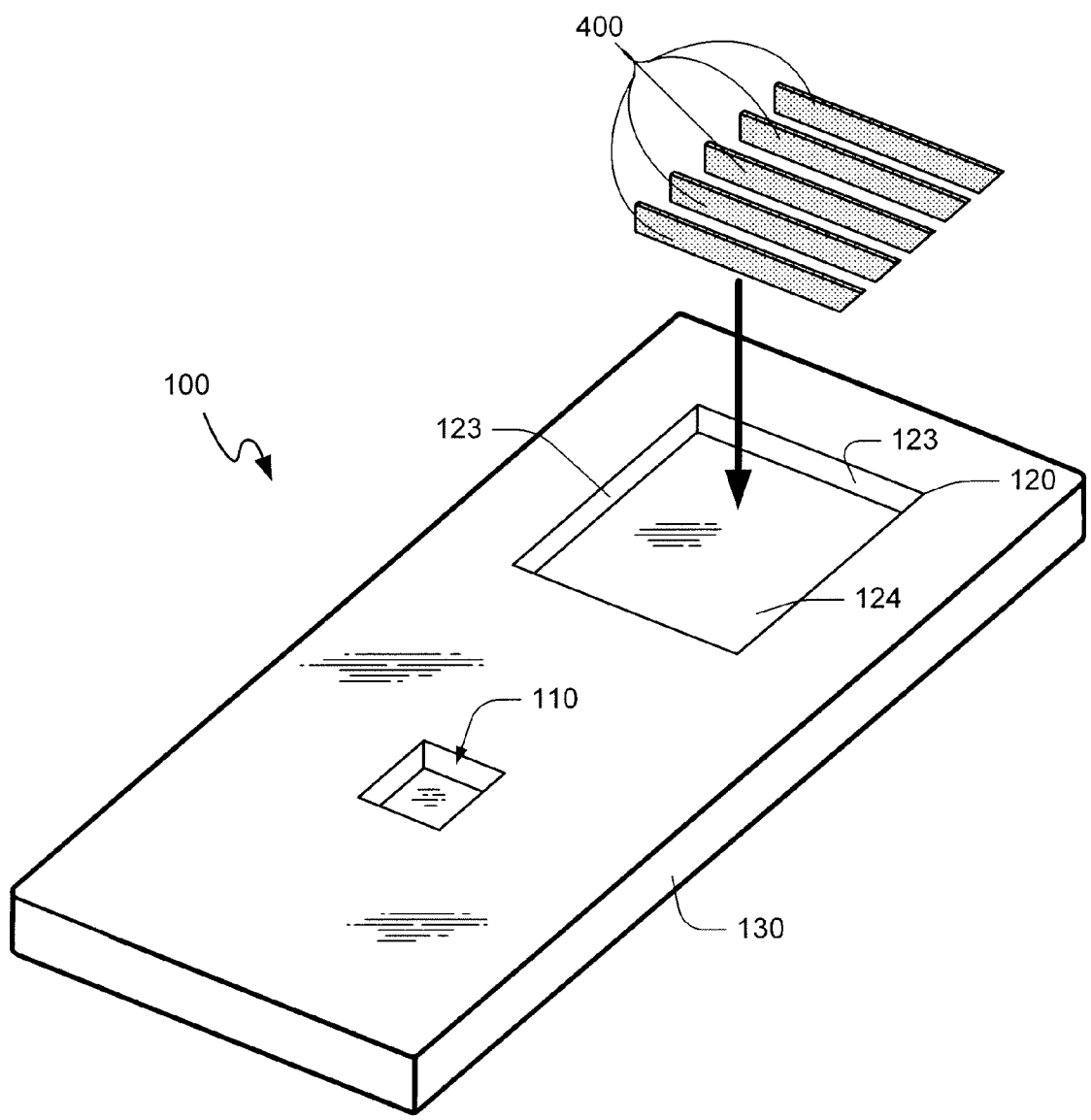
FIG. 4B is a perspective view of a portion of an electronic assembly of the present invention illustrating a preformed intracavity structure being placed within a cavity in the substrate.
Figure 4C:
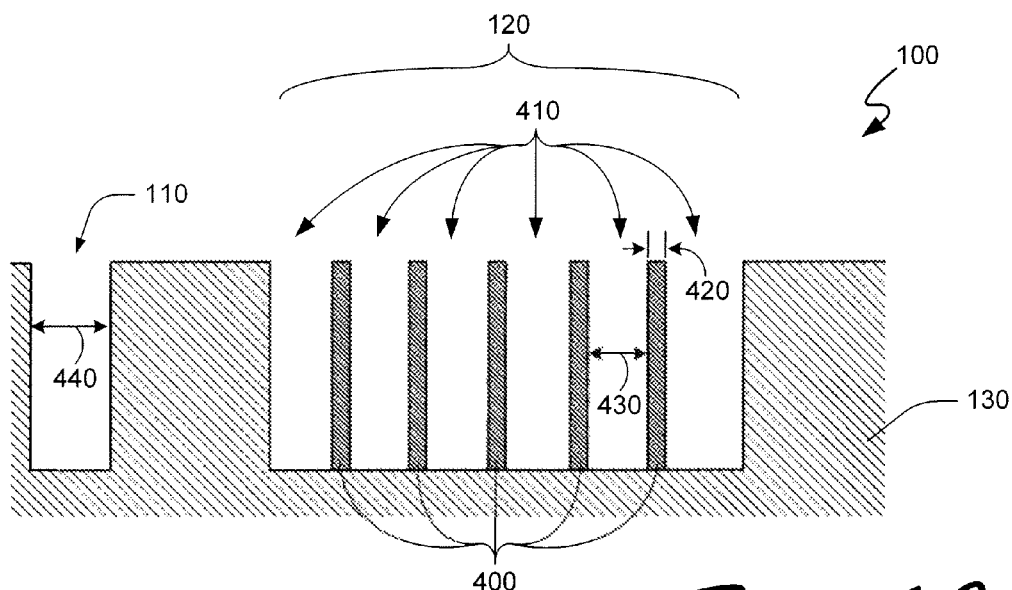
FIG. 4C is a cross-sectional view of a substrate of the present invention, the cross section being taken through a line formed between B-B' in FIG. 4A, illustrating features of vias or cavities.
Figure 5:
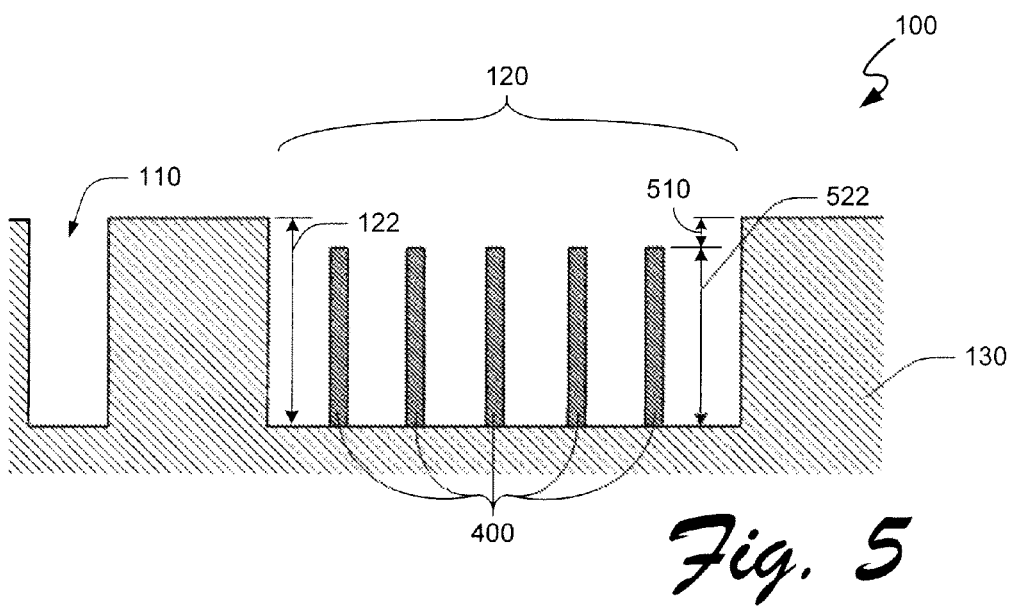
FIG. 5 is a cross-sectional view of a substrate of the present invention illustrating reducing height of intracavity structure features.

With reference to FIG. 4C, a cross section of the substrate 130 is shown, where the cross section was taken along a witness line extended between points B and B' in FIG. 4A. FIGS. 5 and 7-12 also show similar cross sectional depictions. In an exemplary embodiment, a horizontal dimension of a subcavity 410 is defined by the geometry and placement of elements of a intracavity structure 400, and may range, for example, between 5 to 20 microns, and in one embodiment, the thickness 420 of each element of an intracavity structure 400 is smaller than the distance or width 430 between adjacent elements of the intracavity structure 400. Alternatively, the thickness 420 of each element of an intracavity structure 400 may vary, and may be selected to comprise suitable dimensions to ensure even and efficient fill of a subcavity 410. For example but not by way of limitation, in one embodiment the thickness 420 of each element of an intracavity structure 400 may exceed the distance 430 between adjacent elements of the intracavity structure 400. In another embodiment, the placement of elements in the intracavity structure 400 is selected to create a subcavity width 430 that is substantially the same width as a smaller via 110. In one embodiment illustrated in FIG. 5, elements of the intracavity structure 400 are reduced in height by a predetermined amount 510 so that the reduced height 522 of the intracavity structure 400 is less than the depth 122 of the via or cavity 120. In one embodiment, elements of the intracavity structure are reduced in height by less than 50% of their originally fabricated height. In another embodiment, elements of the intracavity structure are reduced in height by a predetermined amount 510 that is equal to the final deposited thickness of the conductive substance (see, e.g., 800, FIG. 9). Height adjustment of the intracavity structure 400 may be followed by appropriate cleaning steps to remove residues. Those of skill in the relevant arts should appreciate that pre-fabricated intracavity structures 400 may also be fabricated to any desired height such as a height equal to or less than the depth 122 of the via or cavity 120 with or without a separate height reduction step.

Figure 7:
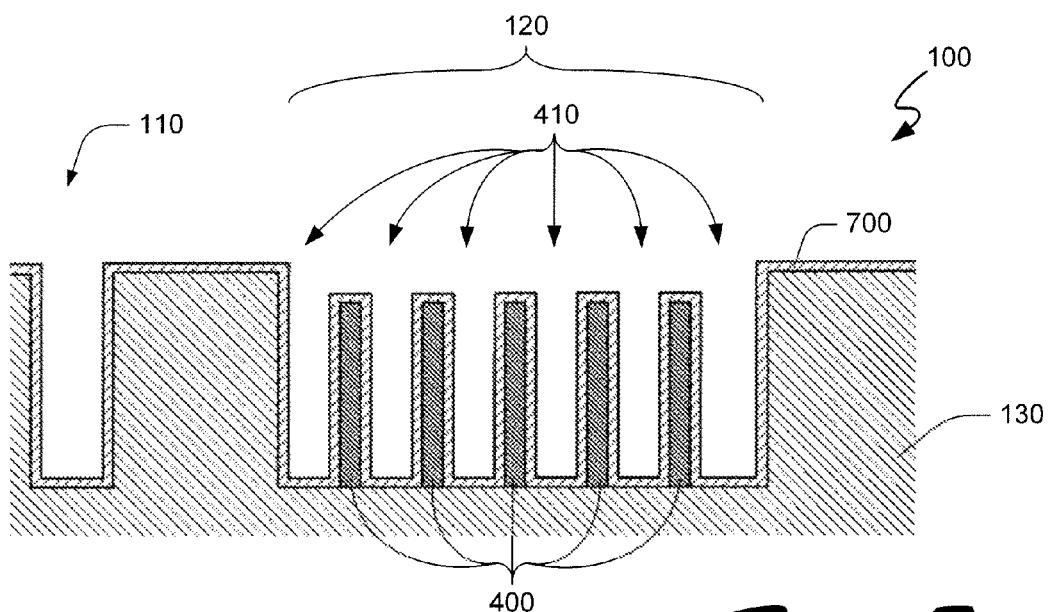
FIG. 7 is a cross-sectional view of a substrate of the present invention showing a coating with a barrier layer and/or seed layer.

As shown in FIG. 7 after the intracavity structure 400 is formed or deposited within the cavity or via 120, in one embodiment the substrate 130 is coated with a suitable barrier layer and/or seed layer 700 before deposition of a conductive material. The barrier and/or seed layer 700 also conformally coats the interior spaces of the via or cavity 120 as well as the intracavity structure 400.

Figure 2:
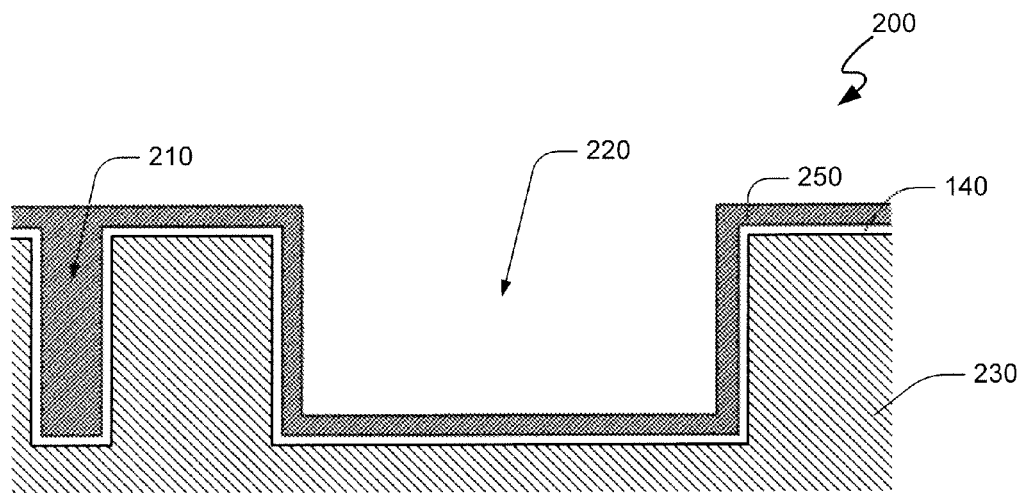
FIG. 2 is a cross sectional view of a prior art substrate showing filling of vias or cavities of varying dimension.
Figure 8:
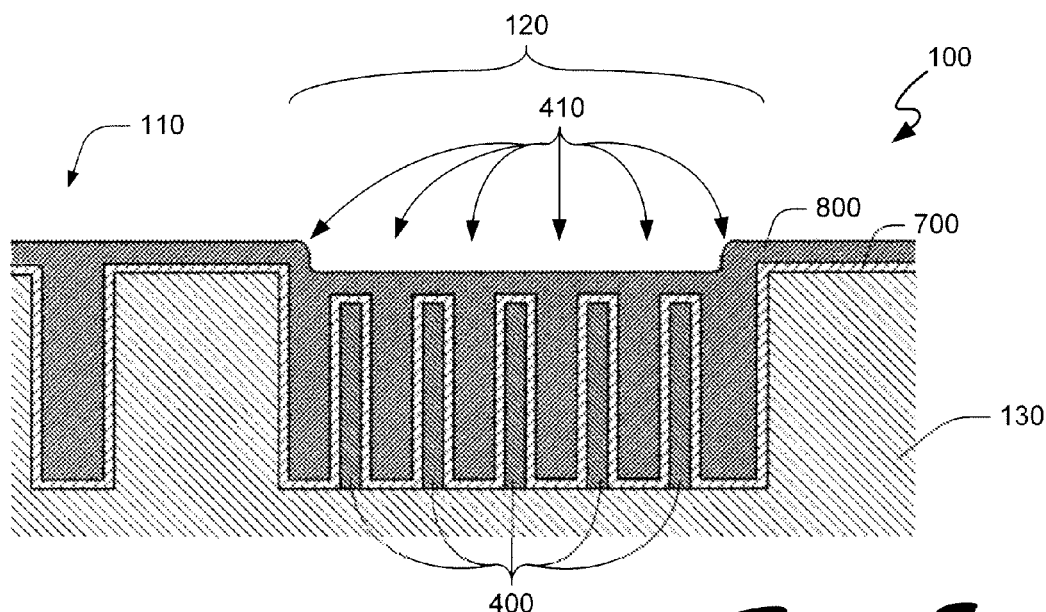
FIG. 8 is a cross-sectional view of a substrate of the present invention showing a conductive material deposited on the barrier and/or seed layer on the substrate.

With reference to FIG. 8, a conductive material 800 is shown deposited on the barrier and/or seed layer 700 on the substrate 130, coating and at least partially filling the cavities 110, 120, and subcavities 410. In one embodiment, the deposition process includes coating with a conductive material such as a metal using a plating bath containing superfilling additives and an adequate plating process to produce void-free depositions in the small cavity 110. The partitioned large cavity 120 with the recessed intracavity structure 400 is thus substantially filled while the small cavity 110 is filled. As FIG. 8 shows when compared to prior art FIG. 2, processes of the present invention produce a dramatic decrease in the amount of conductive material deposited in a single step without buildup of a substantial overburden, minimizing material and process costs.

Figure 3:
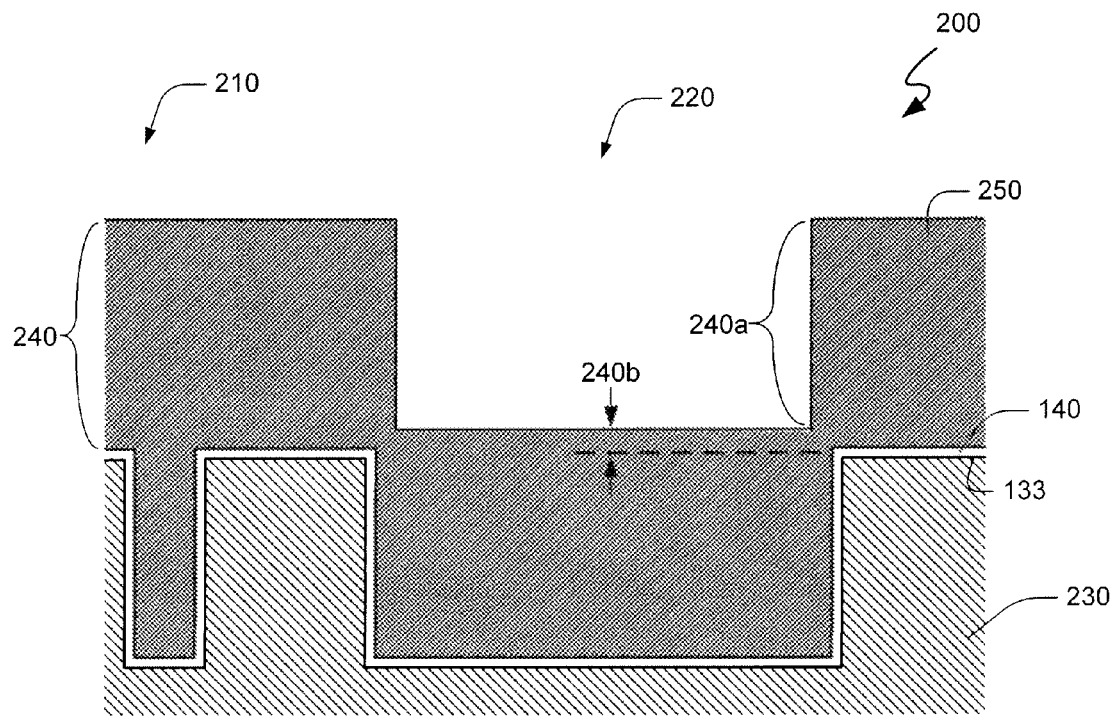
FIG. 3 is a cross sectional view of a prior art substrate showing filling of vias or cavities of varying dimension, with a substantial overburden illustrated.
Figure 9:
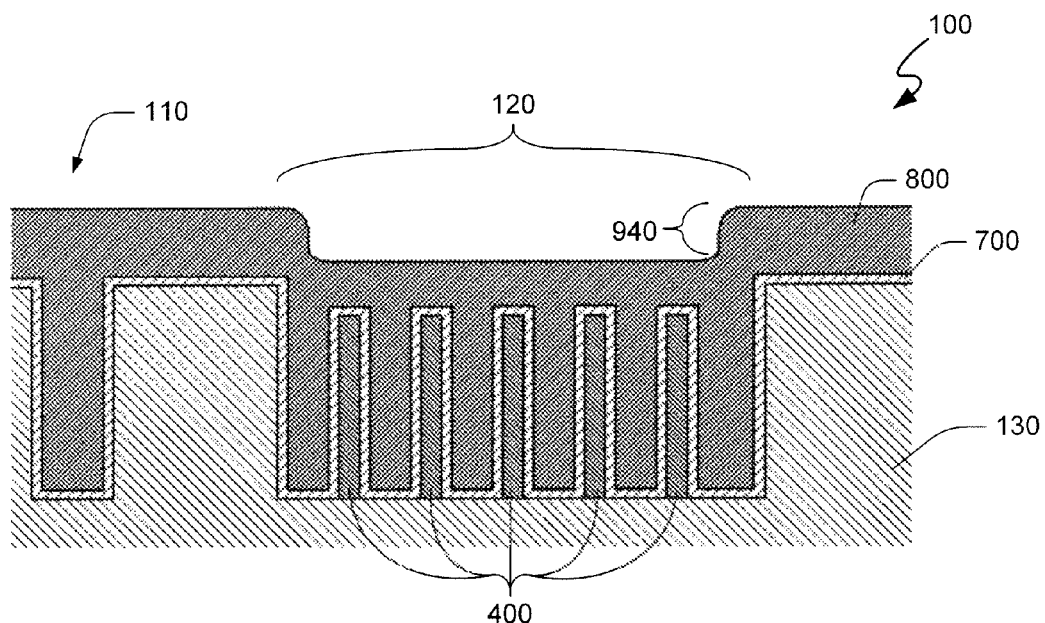
FIG. 9 is a cross-sectional view of a substrate of the present invention showing additional conductive material completely filling a large cavity.

With reference to FIG. 9, when additional conductive material completely fills the large cavity, an overburden 940 is created that is substantially smaller than the overburden resulting from prior art processes shown in FIG. 3 (240). The smaller total overburden and overburden range greatly improves the throughput of any subsequent metal removal steps in the present invention.

In various embodiments, various materials may be used as the conductive material 800 to fill cavities or vias 110, 120. These materials include, but are not limited to copper, nickel, tungsten, silver, aluminum or suitable metal or alloys. Although embodiments discussed in regards to the present invention identify such materials as "conductive materials," those of ordinary skill in the arts appreciate that other substances, including nonconductive substances, may be used in a similar manner to completely or partially fill cavities or vias 110, 120 to achieve a desired result.

Figure 10:
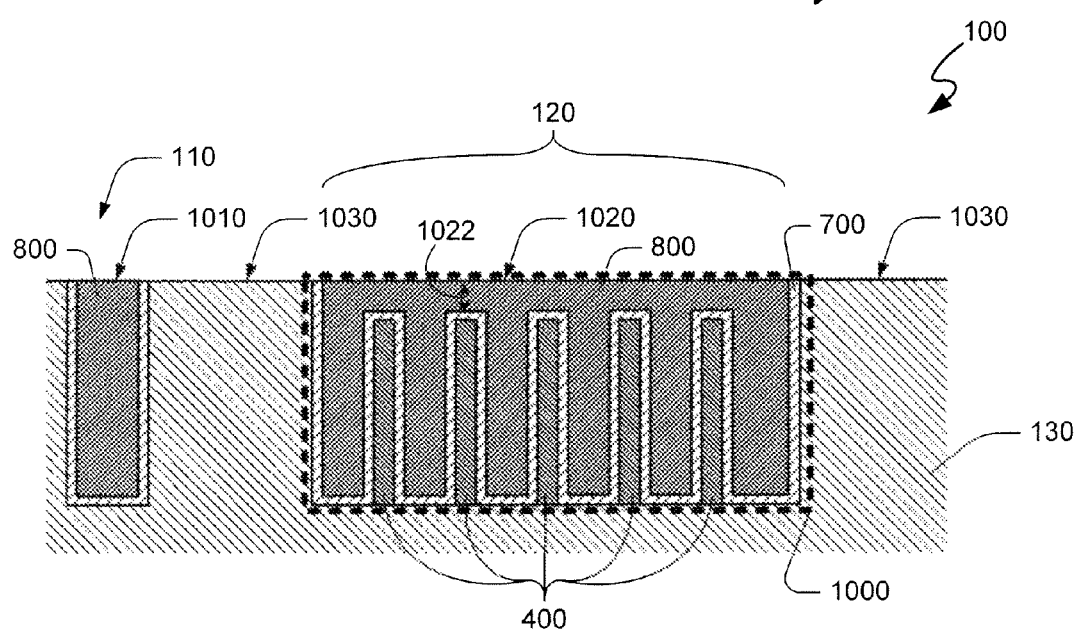
FIG. 10 is a cross-sectional view of a substrate of the present invention illustrating a depiction of the substrate after a structure is polished.

In certain embodiments, partitioning the large cavities 120 into subcavities 410 dramatically reduces the conductive material coating times from more than 120 minutes to less than 20 minutes. Further, methods of the present invention produce a dramatic reduction in conductive material overburden 940 from more than 50 μm for prior art approaches to less than 5 μm in certain implementations. The smaller overburden or other undesired substances may be easily removed by conventional processes such as CMP or eCMP methods. With reference to FIG. 10, the polished structure within the dashed box 1000 (the dashed box is for illustration purposes only and does not comprise part of the disclosed invention) includes conductive material-filled subcavities, separated by a now integrated intracavity structure 400. In an alternate embodiment, the volume above 1022 the integrated intracavity structure 400 is filled with a contiguous conductive material 800. In certain embodiments, the intracavity structure 400 acts as a stiffening member, especially in alternate implementations where the sidewalls are coated with high modulus barrier materials such as Ta, TaN, TaN/Ta, and WCN. The top surface 1020 of the polished structure 1000 forms a substantially planar surface with the polished top 1030 of the substrate 130, and the polished top 1010 of the smaller cavity or via 110. The deposited conductive material 800 may also be bonded to other structures.

For some applications, where the cavity depth (FIG. 5, 122) may range, for example, from 100 μm to more than 200 μm, by using methods of the present invention, the metal overburden may be reduced to less than 20 μm. Reducing or polishing a thick metal overburden is expensive and time consuming. In certain embodiments it is possible to remove most of the excess conductive material by a high precision, low force, high speed, and high throughput milling machine using a polyether phosphate solution as lubricant and a metal passivating agent. After the conductive material milling step is completed, any remaining unwanted metal or conductive material is removed by a conventional eCMP or CMP method.

Figure 11:
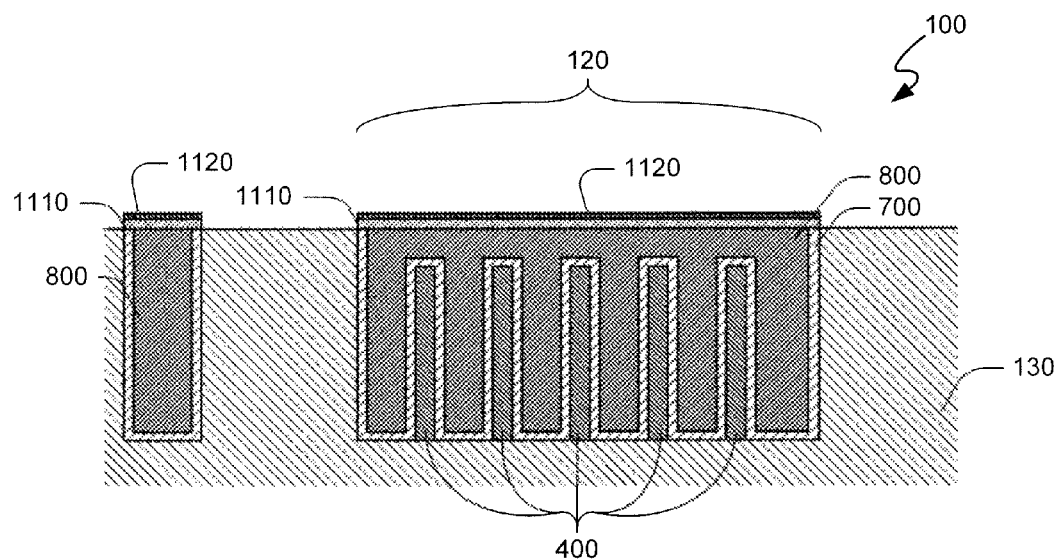
FIG. 11 illustrates a cross-sectional view of a substrate of the present invention where conductive material that was deposited over an intracavity structure is selectively coated by a suitable barrier material.

With reference to FIG. 11, in alternate embodiments of this invention, the conductive material 800 deposited over the intracavity structure 400 may be selectively coated with a suitable barrier material 1110. For example, but not by way of limitation, CoWP and NiP may be deposited over the contiguous conductive material 800 by a method such as an electroless plating method. In an alternate embodiment, for bonding applications, the barrier material 1110 (such as NiP or CoWP) is preferably coated with gold by electroless methods to form a bonding layer 1120. Several desirable gold coated surfaces can be aligned and bonded at low temperatures. In alternate implementations, other barrier layers 1110 or films using materials such as CoBP and CoWP may be applied over the contiguous conductive material region of the filled via or cavity 120.

Figure 12:
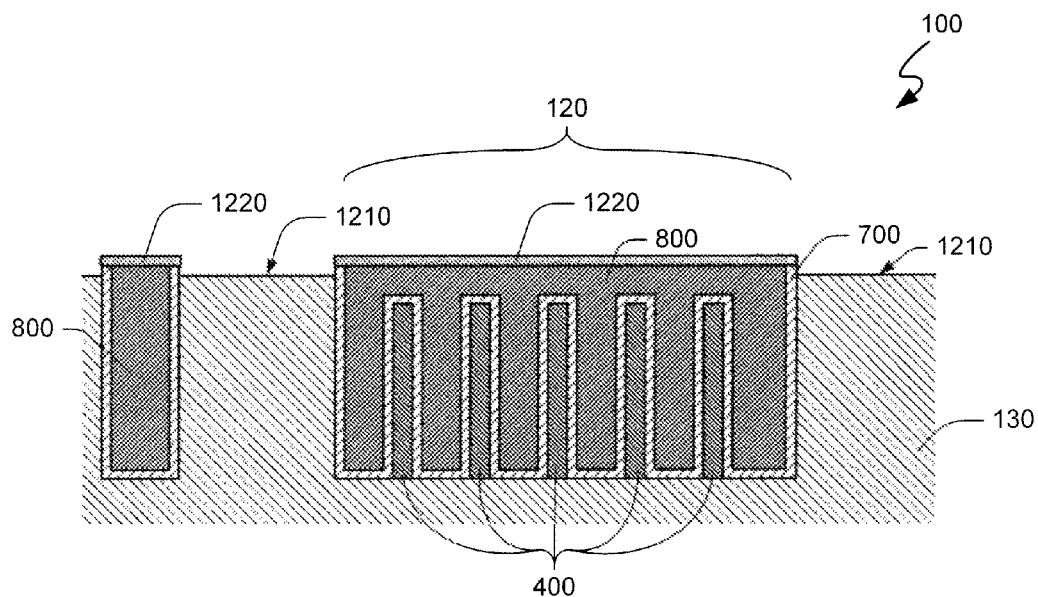
FIG. 12 shows a cross-sectional view of a substrate of the present invention where a thin layer of a material is selectively deposited over a conductive material that fills a via or cavity.

As shown in FIG. 12, in another embodiment of this invention, a thin layer 1220 (for example, but not by way of limitation, from 10 nm to 5000 nm in thickness) of a material such as indium may be selectively deposited over the conductive material 800 that fills the via or cavity 120. The indium layer 1220 may be used as a bonding layer at temperatures below 400 degrees Celsius. For improved device yields, in various embodiments it may be preferable to recess or remove portions of the substrate 130. This reduction or recess process may be accomplished by a process such as an RIE process followed by a possible cleaning step. In some embodiments, the reduction/recess steps may be conducted before the thin layer 1220 is deposited on the conductive material 800. This embodiment creates a new surface 1210 that causes any bond pads formed on the layer 1220 to be elevated above the substrate surface 1210.

Those of skill in the art also appreciate that the intracavity structures 400 of the present invention provide structural strength in the finished conductive element that results from filling the via or cavity 120 with a conductive material. Such strength may be desired when, for example, a bonding pad is to be fabricated on a surface of the filled via or cavity, and a significant mechanical force is required to be applied to the surface of the filled via or cavity to bond a device such as a bond wire to the bonding pad.

In another embodiment of this invention, the externally fabricated structure 400 may be inserted into the large cavities or vias 120 in the substrate 130. The conductive material is then plated substantially onto the substrate. The deposition step is momentarily stopped then the fabricated structure 400 is carefully removed. The substrate may be rinsed briefly to remove any residues or particulates before plating to complete the filling of the features of interest, such as a via or cavity 120. As discussed in more depth below, alternative embodiments allow from insertion of the pre-formed intracavity structure into either the top of the via or cavity 120, or through the bottom of a bottomless via or cavity 120.

Figure 13:
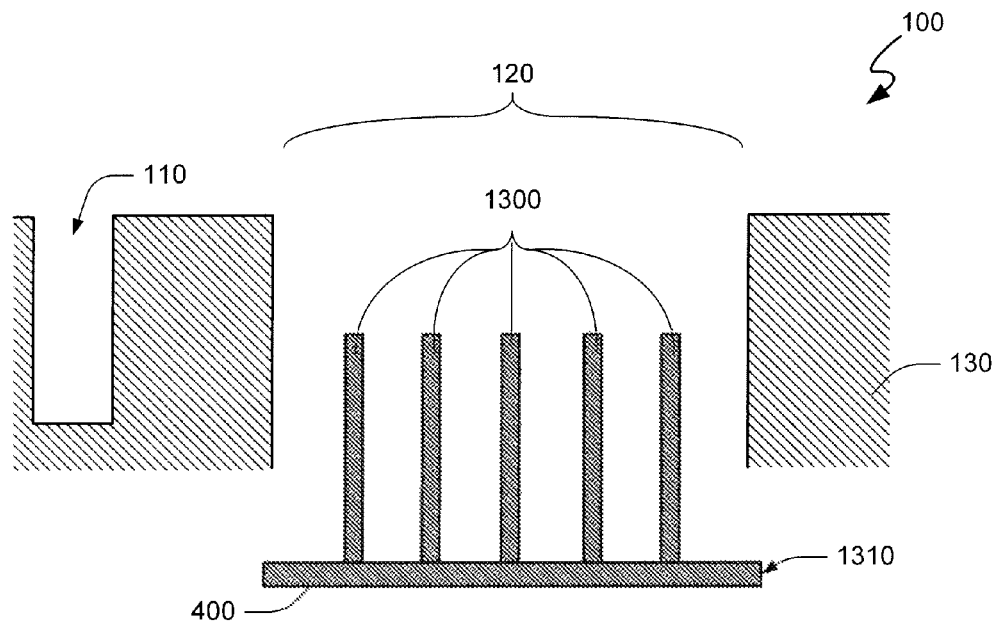
FIG. 13 illustrates a cross-sectional view of a substrate of the present invention with a bottomless cavity or via, and an intracavity structure being inserted into the cavity or via from the bottom of the substrate.
Figure 23:
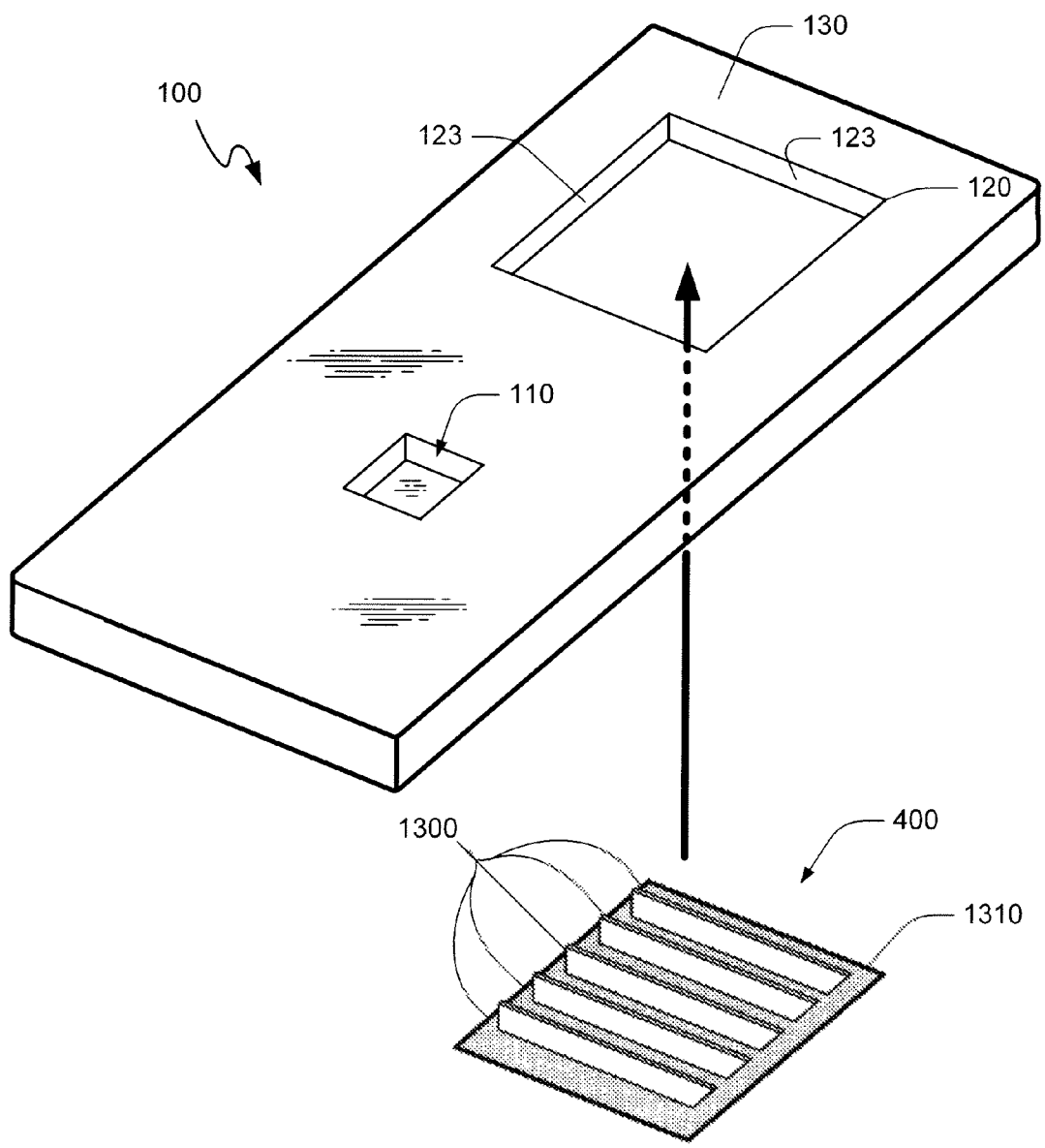
FIG. 23 is a perspective view of a portion of an electronic assembly of the present invention illustrating a preformed intracavity structure being placed within a cavity or via in the substrate from a bottom opening of the cavity or via.

As shown in cross section in FIG. 13 and by perspective in FIG. 23, a via or cavity 120 may be formed in the substrate 130 without a bottom. An intracavity structure 400 is inserted to the via or cavity 120 through a bottom side of the substrate 130. In various embodiments, the intracavity structure 400 may be insertable and removable, and may be reusable, dissolvable, or disposable. Those of skill in the art appreciate that the intracavity structure 400 may comprise any suitable shape to allow definition of subcavities within the via or cavity 120, and the relative thickness (see, e.g., 420 in regards to FIG. 4C) of the tines 1300 shown on the intracavity structure 400 may vary depending on desired fill rates of subcavity volumes. As FIGS. 13-21 are shown in cross section, the view of the intracavity structure 400 is also shown in cross section. While the tines 1300 are shown in rectilinear shape in FIGS. 13 and 23, those of skill in the art appreciate that the tines may comprise any suitable cross section, including a trapezoidal cross section with the broad end of the trapezoid adjacent to the base 1310 of the intracavity structure 400, whereby extraction of the intracavity structure 400 from a deposited conductive material may be facilitated.

Figure 14:
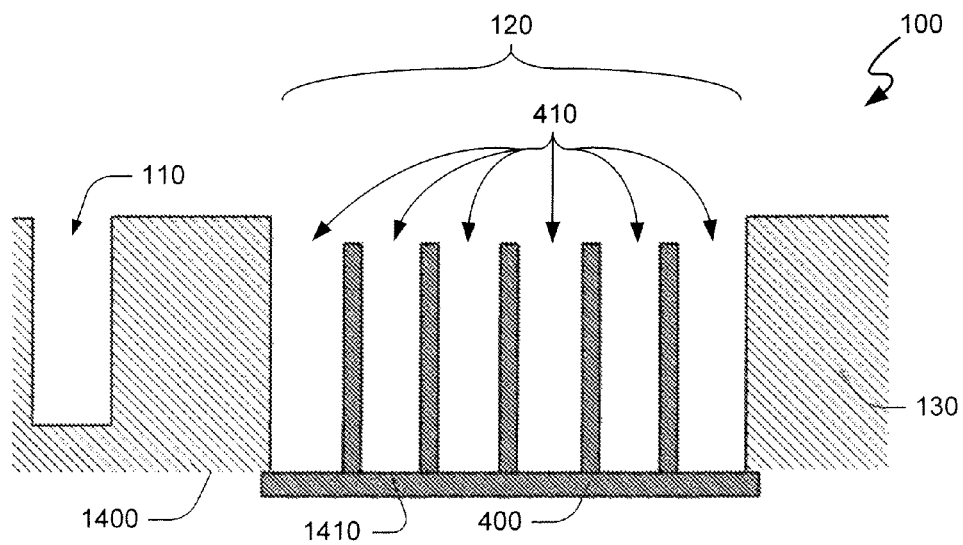
FIG. 14 illustrates a cross-sectional view of a substrate of the present invention with a bottomless cavity or via, where an intracavity structure is positioned in the cavity or via from the bottom of the substrate.
Figure 15:
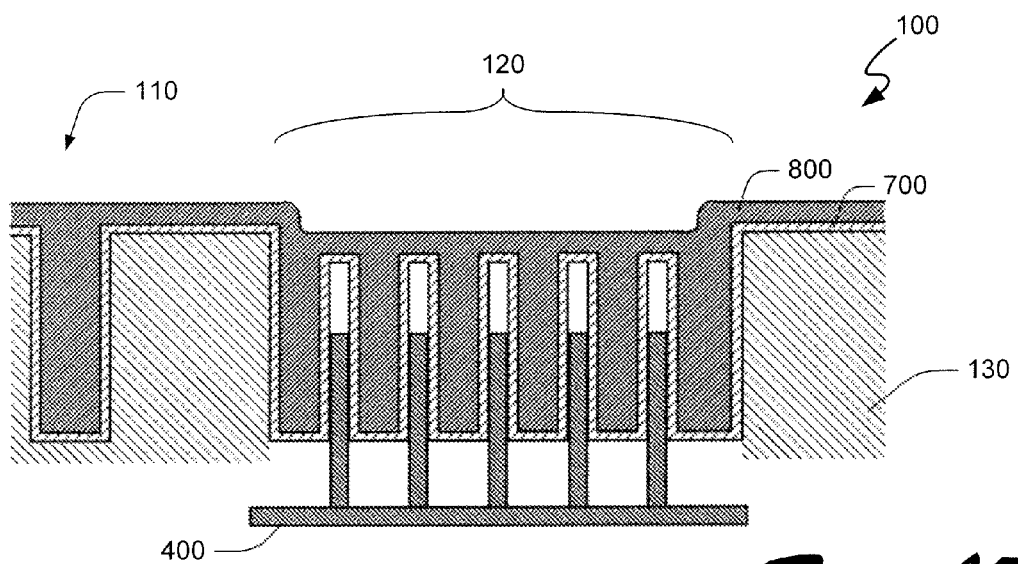
FIG. 15 shows a cross-sectional view of a substrate of the present invention with a bottomless cavity or via, where a conductive material had been deposited in the cavity or via, and the intracavity structure is partially withdrawn.
Figure 16:
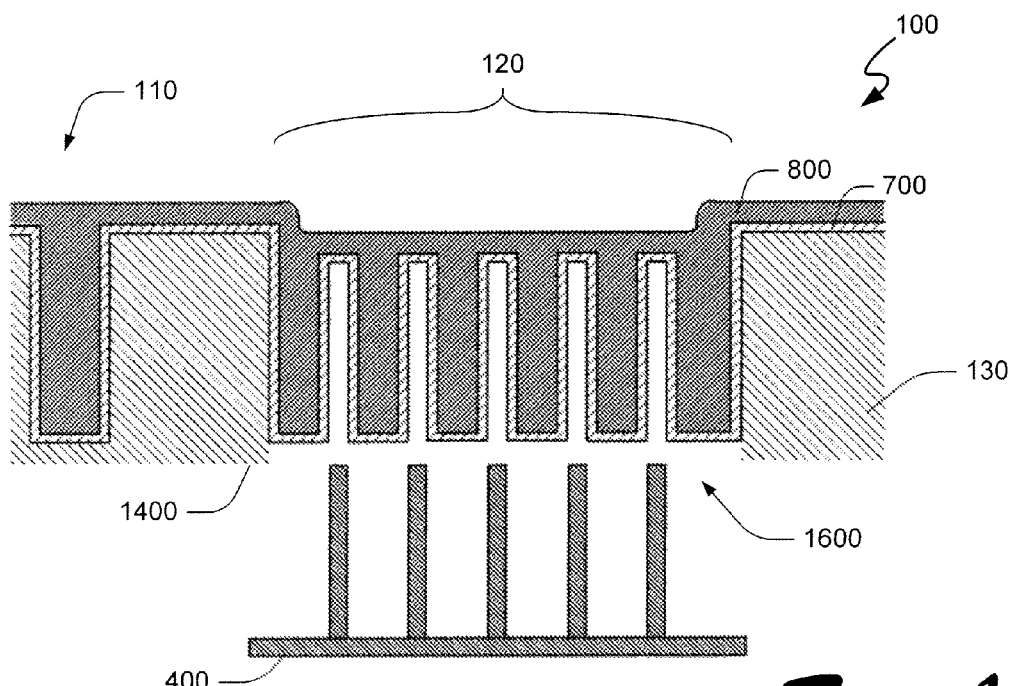
FIG. 16 shows a cross-sectional view of a substrate of the present invention with a bottomless cavity or via, where a conductive material had been deposited in the cavity or via, and the intracavity structure is withdrawn.

Referring to FIG. 14, the intracavity structure 400 is fully inserted into the via or cavity 120, and in the illustrated embodiment, by approximating a bottom surface 1400 of the substrate 130, a surface of the intracavity structure defines a temporary bottom 1410 for the via or cavity 120, and similarly to the approach discussed in regards to FIG. 4C, the via or cavity 120 is thereby fully or partially partitioned into a plurality of subcavities 410. As discussed in regards to FIGS. 7-9, the via or cavity 120 may be partially or completely filled with a conductive material 800. FIG. 15 shows the via or cavity 120 coated with barrier/seed layer 700 and filled with conductive deposition material 800, and the intracavity structure 400 being withdrawn, (or alternatively, dissolved or otherwise removed) from the filled via or cavity 120. The intracavity structure 400 is shown fully withdrawn in FIG. 16, leaving defined voids 1600 within the filled cavity or via 120. Those of skill in the art appreciate that the voids 1600 may be left in place, or in one embodiment, additional conductive or nonconductive deposition material may then be deposited on the bottom side 1400 of the substrate 130 to fill the voids 1600, and if desired, additional planarization steps may be undertaken to remove any overburden from the bottom side 1400 of the substrate 130.

Figure 17:
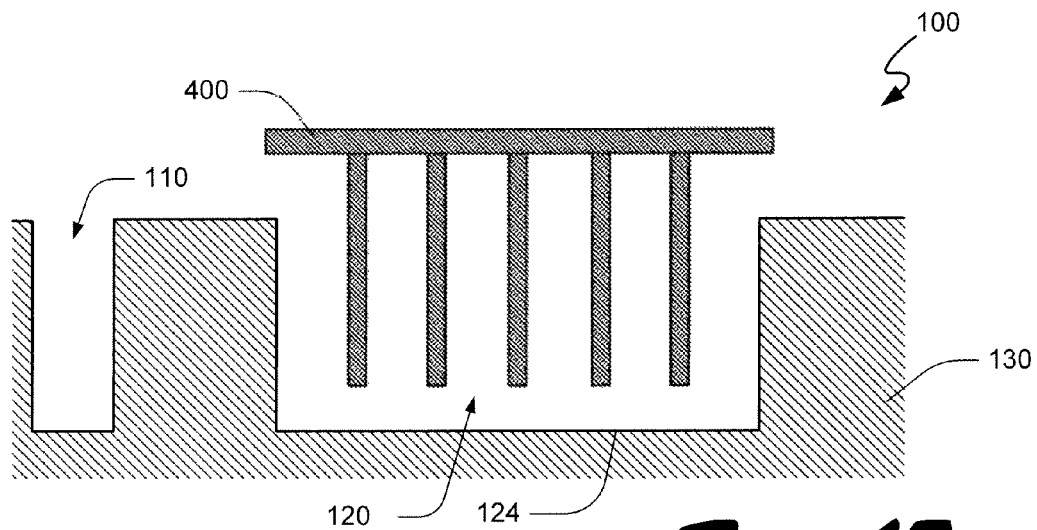
FIG. 17 shows a cross-sectional view of a substrate of the present invention, where an intracavity structure has been positioned within at least part of a cavity or via of the substrate.
Figure 18:
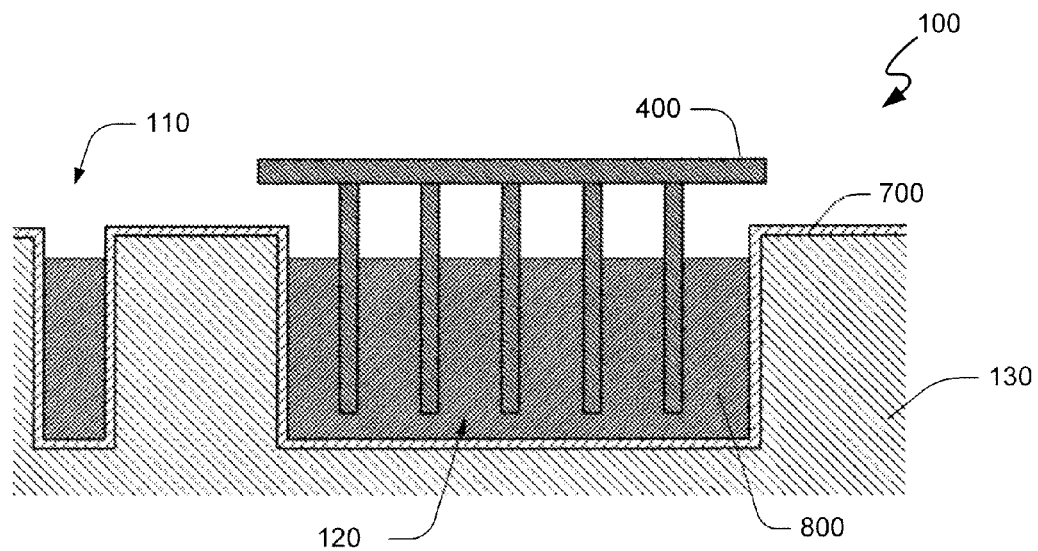
FIG. 18 shows a cross-sectional view of a substrate of the present invention, where an intracavity structure has been positioned within at least part of a cavity or via of the substrate, and a conductive material deposited as to partially or substantially fill vias and cavities within the substrate.
Figure 22:
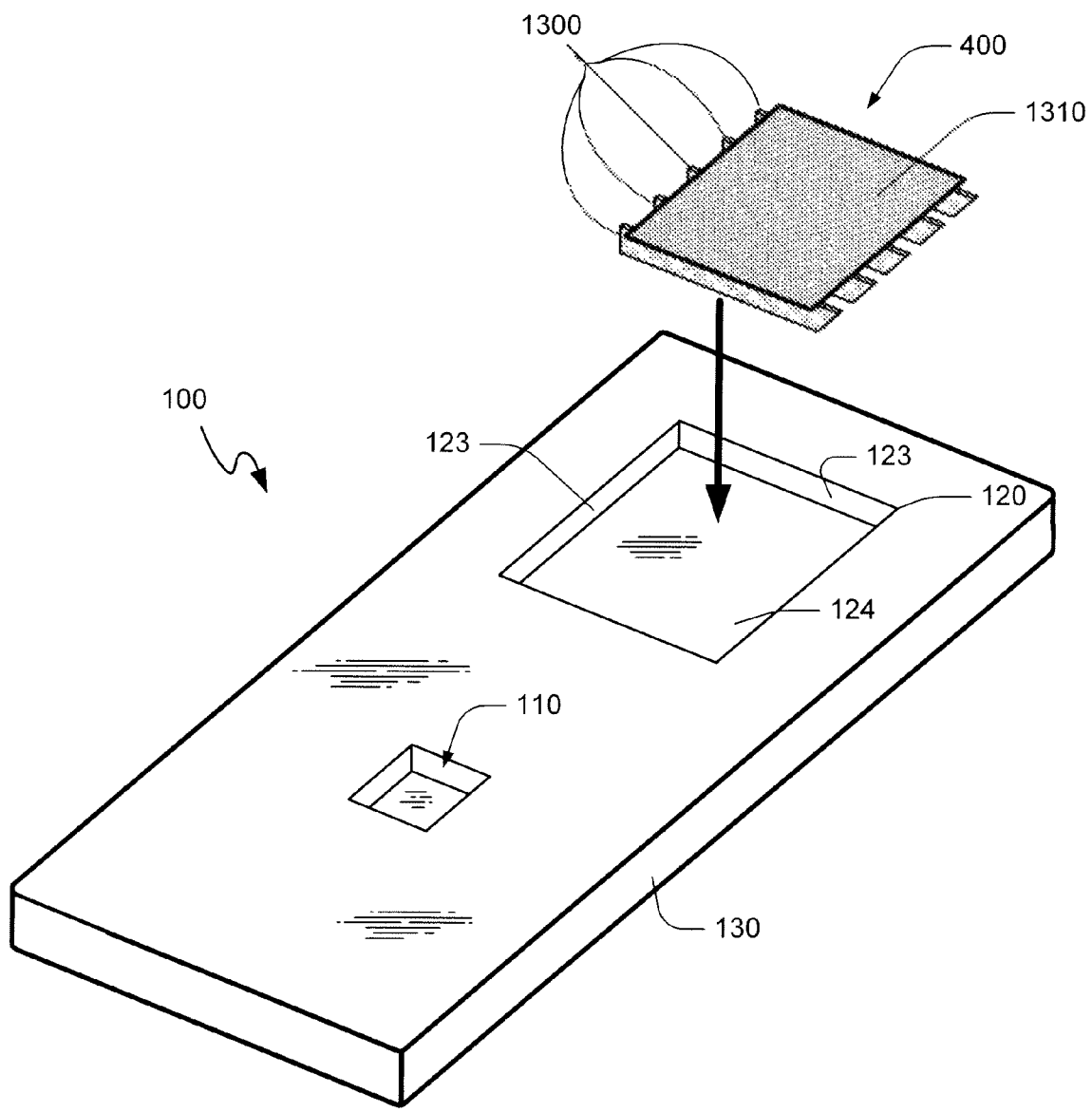
FIG. 22 is a perspective view of a portion of an electronic assembly of the present invention illustrating a preformed intracavity structure being placed within a cavity or via in the substrate from a top opening of the cavity or via.

In another embodiment shown in cross section in FIG. 17 and by perspective in FIG. 22, the pre-formed intracavity structure 400 is partially or completely inserted into a via or cavity 120 in the substrate 130, the via or cavity 120 having a bottom 124. As shown in FIG. 18, the substrate 130 is optionally coated with a suitable barrier layer and/or seed layer 700 before deposition of a conductive material 800, and conductive material 800 is deposited, partially filling the via 110 and the via or cavity 120. During this step, additional conductive material creating an overburden may be deposited on exposed surfaces such as the top surface of the substrate 130, but for purposes of clarity, such overburden is omitted from FIGS. 18 and 19. Those of skill in the art recognize that the amount of conductive material 800 initially deposited may slightly fill, partially fill, substantially fill, completely fill, or overfill the via 110 and via or cavity 120.

Figure 19:
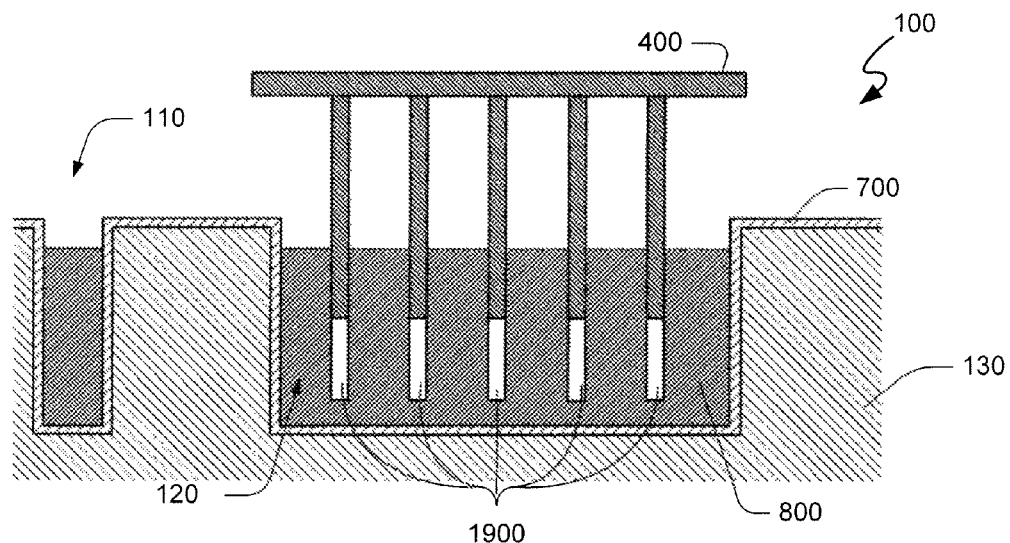
FIG. 19 shows a cross-sectional view of a substrate of the present invention, where an intracavity structure is being withdrawn from a partially or substantially filled cavity or via.
Figure 20:
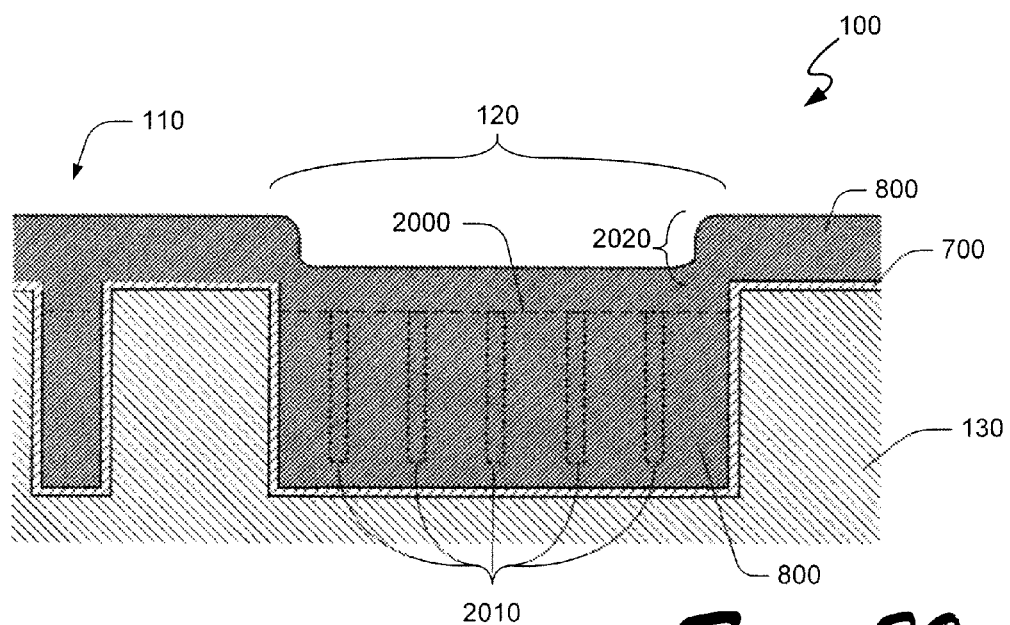
FIG. 20 illustrates a cross-sectional view of a substrate of the present invention, where an intracavity structure has been withdrawn from a partially filled cavity or via, and then subsequent deposition of conductive material filling the remainder of cavities and vias in the substrate.
Figure 21:
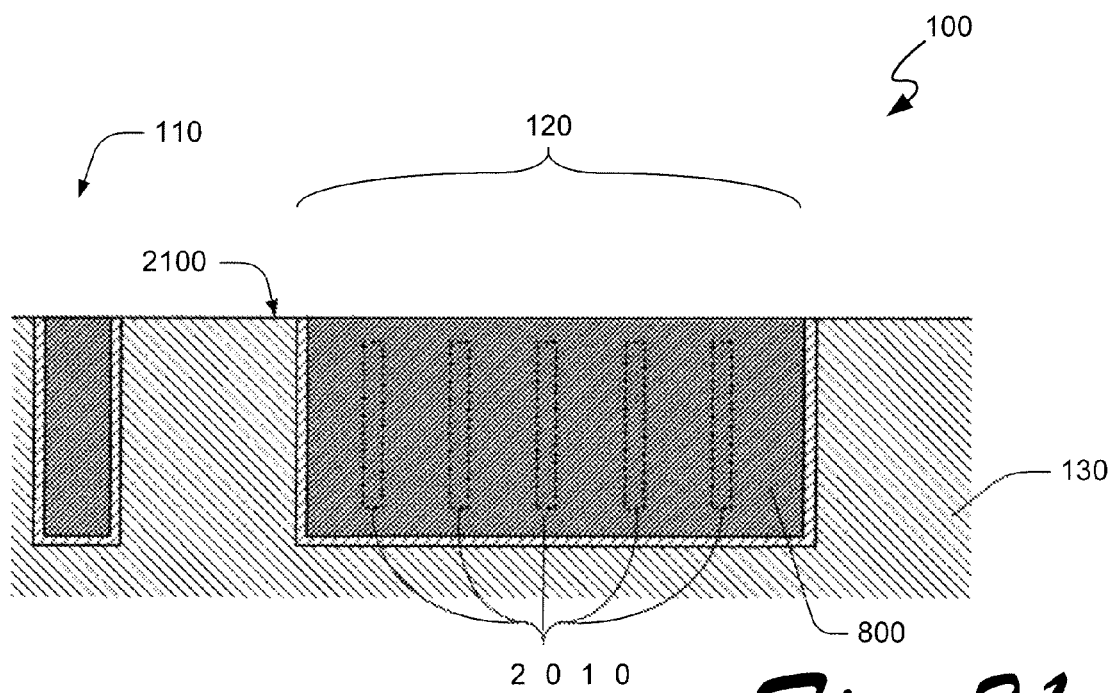
FIG. 21 illustrates a cross-sectional view of a substrate of the present invention, where the overburden above a top surface of the substrate has been removed, forming a planar or substantially planar surface with respect to the top surface of the substrate.

FIG. 19 shows the intracavity structure 400 being withdrawn (or alternatively dissolved or otherwise removed) from the partially filled via or cavity 120, leaving behind voids 1900 in the conductive material. In a subsequent step shown in FIG. 20, additional conductive material 800 is deposited, completely filling the via 110, the via or cavity 120, and the voids 1900 (the now-filled voids 2010 and the prior fill level 2000 are shown for comparative purposes in dashed lines). IN another embodiment, the structure 400 may be selectively removed or dissolved through application of a suitable solvent or other removal process. As discussed in regards to other embodiments of the present invention and as illustrated in FIG. 21, a planarization process may be implemented to remove the deposited overburden 2020, and produce a substantially planar top surface 2100 of the substrate 130.

In still other embodiments of the present invention, an electrically reactive component may be formed within a cavity or via 120. In this embodiment, the walls of the subcavity may be coated with a conformal insulator. The insulator may be coated by a suitable metal such as platinum, rhodium. WCN, or alpha-Ta (i.e. the low resistivity crystalline phase of Tantalum). The remaining gap is the filled with a suitable insulator, preferably a high dielectric constant insulator. After the filling step, the substrate is planarized to form a high performance capacitor. Such device structure may find applications in such practices as high precision timing elements.

In another embodiment, methods of the present invention may be utilized to deposit traces or signal lines with embedded void areas that have purposely been left unfilled, or filled with a nonconductor or dielectric. Those of skill in the relevant arts appreciate that high frequency signals tend to travel toward the surface of a conductor, and the higher the frequency, the less the signal penetrates into the cross section of the conductor (also known as the "skin effect"). This effect allows high frequency signals to propagate through these void-embedded or dielectric-filled signal lines substantially unimpeded. Further, this use of intentionally fabricated voids or dielectric-filled trace or signal lines may also be desirable to obtain a desired characteristic impedance of the trace or signal lines, where higher frequency signals may effectively propagate, while lower frequency signals are selectively impeded. Embodiments of such void-containing traces or signals lines may also provide for a filtered signal line, such as provided by a passive high-pass filter. Selection of the geometry and aspect of the signal lines with respect to the embedded voids or dielectric fills provides for flexibility of selecting characteristic impedance or transmission line performance.

Other embodiments of the invention will be apparent to those skilled in the art from consideration of the specification and practice of the invention disclosed herein. Any combination and/or subset of the elements of the methods described herein may be practiced in any suitable order and in conjunction with any system, device, and/or process. The methods described herein can be implemented in any suitable manner, such as through software operating on one or more computer systems or fabrication equipment controlled by computer systems. It is intended that the specification and examples be considered as exemplary only, with a true scope and spirit of the invention being indicated by the following claims.

What is claimed is:

1. A method for filling a cavity defined within a substrate, the cavity having sidewalls, the steps comprising:
   placing an intracavity structure within the cavity, the intracavity structure partitioning the cavity into a plurality of subcavities, wherein placing the intracavity structure within the cavity includes:
     forming the intracavity structure outside of the cavity; and
     inserting the formed intracavity structure into the cavity; and
   substantially filling the subcavities with a conductive deposition material.

2. The method as defined in claim 1, wherein placing an intracavity structure within the cavity further comprises:
   depositing a structure material by a photolithographic process; and
   reducing at least part of the intracavity structure through an etching process.

3. The method as defined in claim 2, wherein reducing at least part of the intracavity structure through an etching process further comprises adjusting a vertical dimension of the intracavity structure to an amount less than a predetermined vertical dimension of the sidewalls of the cavity.

4. The method as defined in claim 1, wherein placing an intracavity structure within the cavity further comprises:
   aligning the intracavity structure within the cavity; and
   partially inserting the intracavity structure into the cavity.

5. The method as defined in claim 4, further comprising:
   removing the intracavity structure from the cavity.

6. The method as defined in claim 1, wherein placing an intracavity structure within the cavity further comprises:
   depositing a dissolvable material within the cavity.

7. The method as defined in claim 6 further comprising:
   dissolving the dissolvable material with a solvent.

8. The method as defined in claim 1, wherein placing an intracavity structure within the cavity further comprises:
   aligning the intracavity structure within the cavity; and
   inserting the intracavity structure into the cavity, wherein a surface of the intracavity surface approximates a bottom surface of the substrate.

9. The method as defined in claim 8, further comprising:
   removing the intracavity structure from the cavity.

10. The method as defined in claim 9, further comprising:
    depositing a second conductive layer on the conductive deposition material, the second conductive layer deposited in an amount sufficient to fill the cavity and create an overfill above a top surface of the substrate; and
    removing at least a portion of the second conductive layer to form a substantially planar surface including at least the second conductive layer and the substrate.

11. The method as defined in claim 9, further comprising:
    depositing a void-filling conductive deposition material to the bottom surface of the substrate to substantially fill one or more voids.

12. The method as defined in claim 11, further comprising:
    removing at least a portion of the void-filling conductive deposition material to form a substantially planar surface with the bottom surface of the substrate.

13. The method as defined in claim 1, wherein placing the intracavity structure further comprises defining an array of elements selected from group consisting of hexagonal elements, conic elements, rectanguloid elements, cubic elements, trianguloid elements, torroidial elements, rhomboid elements, and combinations thereof.

14. The method as defined in claim 1, further comprising depositing a barrier layer on at least part of the intracavity structure and the sidewalls of the cavity.

15. The method as defined in claim 14, wherein the barrier layer comprises a material selected from the group consisting of Ta, TaN, WCN, TiN, WN, TbN, VN, ZrN, CrN, WC, WN, NbN, AlN, and combinations thereof.

16. The method as defined in claim 1, wherein the cavity further includes a bottom, and the method further comprises depositing a barrier layer on at least part of the intracavity structure, the bottom of the cavity, and the sidewalls of the cavity.

17. The method as defined in claim 1, wherein the conductive deposition material comprises Cu, Ni, W, Ag, Al, alloys thereof, and combinations thereof.

18. The method as defined in claim 1, further comprising:
    depositing a second conductive layer on the conductive deposition material, the second conductive layer deposited in an amount sufficient to fill the cavity and create an overfill above a top surface of the substrate; and
    removing at least a portion of the second conductive layer to form a substantially planar surface including at least the second conductive layer and the substrate.

19. The method as defined in claim 18, wherein the second conductive layer material comprises Cu, Ni, W, Ag, Al, alloys thereof, and combinations thereof.

20. The method as defined in claim 18, further comprising depositing a bonding layer of a bonding material on at least a portion of the surface of the planarized second conductive layer material.

21. The method as defined in claim 18, further comprising depositing a barrier layer material on at least a portion of the planarized second conductive layer material.

22. The method as defined in claim 21, wherein the barrier layer material comprises a material selected from the group consisting of CoP, NiP, CoBP, CoWP, alloys thereof, and combinations thereof.

23. The method as defined in claim 21, further comprising depositing a layer of a bonding material on a surface of the deposited barrier layer.

24. The method as defined in claim 18, wherein removing at least part of the second conductive layer further comprises utilizing at least one of a CMP process, an eCMP process, or a milling process.

25. The method as defined in claim 1, further comprising depositing a conformal insulator within the cavity;
depositing a conductive electrode layer on the conformal insulator;
filling the remaining unoccupied volume of the cavity with a filling insulator; and
planarizing the filling insulator to form a substantially planar surface with the substrate.

26. The method as defined in claim 25, wherein the conductive electrode layer is selected from the group consisting of Pt, Rh, WCN, and alpha-Ta.

27. A method for filling a cavity defined within a substrate, the cavity having a bottom and sidewalls, the steps comprising:
partitioning the cavity into a plurality of subcavities, each of the subcavities having a respective predetermined subcavity volume;
depositing an initial conductive layer within at least one of the subcavity volumes, wherein the initial conductive layer is for electrical communication with a conductive element in the substrate; and
depositing a conductive material within the plurality of subcavities, wherein the conductive material substantially fills at least one of the subcavity volumes to a predetermined amount.

28. The method as defined in claim 27, further comprising:
depositing a second conducive material proximate to the cavity defined within the substrate; and
removing at least part of the second conductive material to form a substantially planar surface including at least the second conductive layer and the substrate.

29. The method as defined in claim 27, wherein the predetermined subcavity volume is less than a volume of a second cavity defined within the substrate.

30. The method as defined in claim 27, wherein the initial conductive layer is selected from the group consisting of a barrier layer, a seed layer, or a combination thereof.

31. A method for filling a cavity defined within a substrate, the cavity having a bottom and sidewalls, the steps comprising:
placing a pre-formed structure within the cavity, the pre-formed structure partitioning the cavity into a plurality of subcavities, wherein the pre-formed structure:
comprises a conductive material;
has a predetermined vertical dimension less than a height dimension of the sidewalls; and
has a predetermined footprint area less than or equal to an area of the bottom of the cavity;
depositing a metal layer within at least one of the subcavity volumes, wherein the metal layer is for electrical communication with a conductive element in the substrate; and
substantially filling the subcavities with a conductive deposition material.

32. A method for filling a cavity defined within a substrate, the cavity having sidewalls, the steps comprising:
placing a pre-formed structure within the cavity, the pre-formed structure partitioning the cavity into a plurality of subcavities;
depositing a metal layer within at least one of the subcavity volumes, wherein the metal layer is for electrical communication with a conductive element in the substrate; and
substantially filling the subcavities with a conductive deposition material.

33. The method as defined in claim 32, wherein:
the cavity further includes a bottom; and
the pre-formed structure:
comprises a conductive material;
has a predetermined vertical dimension less than a height dimension of the sidewalls; and
has a predetermined footprint area less than or equal to an area of the bottom of the cavity.

34. The method as defined in claim 32, wherein the pre-formed structure:
comprises a non-conductive material; and
has a predetermined footprint area less than or equal to an area of the bottom of the cavity.

35. The method as defined in claim 32, wherein at least a portion of the pre-formed structure remains outside of the cavity.

36. The method as defined in claim 35, further comprising removing the pre-formed structure from the cavity after substantially filling the subcavities with a conductive deposition material.

37. The method as defined in claim 36, further comprising:
depositing a second conductive layer on the conductive deposition material, the second conductive layer deposited in an amount sufficient to fill the cavity and create an overfill above a top surface of the substrate; and
removing at least a portion of the second conductive layer to form a substantially planar surface including at least the second conductive layer and the substrate.

38. The method as defined in claim 36, further comprising:
depositing a second conductive layer on a bottom surface of the substrate, the second conductive layer deposited in an amount sufficient to fill voids within the conductive deposition material; and
removing at least a portion of the second conductive layer to form a substantially planar surface on the bottom surface of the substrate.

39. The method as defined in claim 38, wherein substantially filling the subcavities with a conductive deposition material further comprises depositing an amount of conductive deposition material sufficient to fill the cavity and create an overfill above a top surface of the substrate; and further comprising removing at least a portion of the conductive deposition material to form a substantially planar surface including at least the conductive deposition material and a top surface of the substrate.

40. The method as defined in claim 35, further comprising removing the pre-formed structure from the cavity after substantially filling the subcavities with a conductive deposition material.

41. The method as defined in claim 32, wherein the pre-formed structure:
comprises a dissolvable material; and
has a predetermined footprint area less than or equal to an area of the bottom of the cavity.

42. The method as defined in claim 41, further comprising dissolving the pre-formed structure from the cavity after substantially filling the subcavities with a conductive deposition material.

* * * * *